United States Patent
Ohashi et al.

(10) Patent No.: US 9,272,515 B2
(45) Date of Patent: Mar. 1, 2016

(54) LIQUID EJECTING HEAD, LIQUID EJECTING APPARATUS, PIEZOELECTRIC ELEMENT, ULTRASONIC TRANSDUCER, AND ULTRASONIC DEVICE

(71) Applicant: SEIKO EPSON CORPORATION, Tokyo (JP)

(72) Inventors: Koji Ohashi, Matsumoto (JP); Shiro Yazaki, Chino (JP); Eiju Hirai, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/173,883

(22) Filed: Feb. 6, 2014

(65) Prior Publication Data

US 2014/0267508 A1 Sep. 18, 2014

(30) Foreign Application Priority Data

Mar. 13, 2013 (JP) ................. 2013-051086

(51) Int. Cl.
| | |
|---|---|
| *B41J 2/045* | (2006.01) |
| *B41J 2/14* | (2006.01) |
| *H01L 41/08* | (2006.01) |
| *H01L 41/09* | (2006.01) |
| *B41J 2/055* | (2006.01) |
| *B41J 2/16* | (2006.01) |

(52) U.S. Cl.
CPC .............. *B41J 2/14233* (2013.01); *B41J 2/055* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *B41J 2/1646* (2013.01); *H01L 41/081* (2013.01); *H01L 41/0815* (2013.01); *H01L 41/0973* (2013.01); *B41J 2002/14241* (2013.01)

(58) Field of Classification Search
None
See application file for complete search history.

(56) References Cited

U.S. PATENT DOCUMENTS

| | | | |
|---|---|---|---|
| 7,411,339 B2 | 8/2008 | Xin-Shan et al. | |
| 2006/0088737 A1* | 4/2006 | Hirayama et al. | 428/836.2 |
| 2006/0170736 A1* | 8/2006 | Tomozawa et al. | 347/71 |
| 2010/0123761 A1* | 5/2010 | Saito | 347/71 |

FOREIGN PATENT DOCUMENTS

| | | |
|---|---|---|
| JP | 2005-176433 | 6/2005 |
| JP | 2009-272642 | 11/2009 |

* cited by examiner

*Primary Examiner* — Erica Lin
(74) *Attorney, Agent, or Firm* — Workman Nydegger

(57) ABSTRACT

A liquid ejecting head includes a passage-forming substrate provided with a pressure-generating chamber communicating with a nozzle orifice for ejecting a liquid and includes a piezoelectric element including a diaphragm disposed on the passage-forming substrate, a first electrode disposed on the diaphragm, a piezoelectric layer disposed on the first electrode, and second electrode disposed on the piezoelectric layer. The diaphragm includes a metal oxide layer of a metal oxide formed by a gas-phase method and a zirconium oxide layer of zirconium oxide formed by a liquid-phase method.

20 Claims, 15 Drawing Sheets

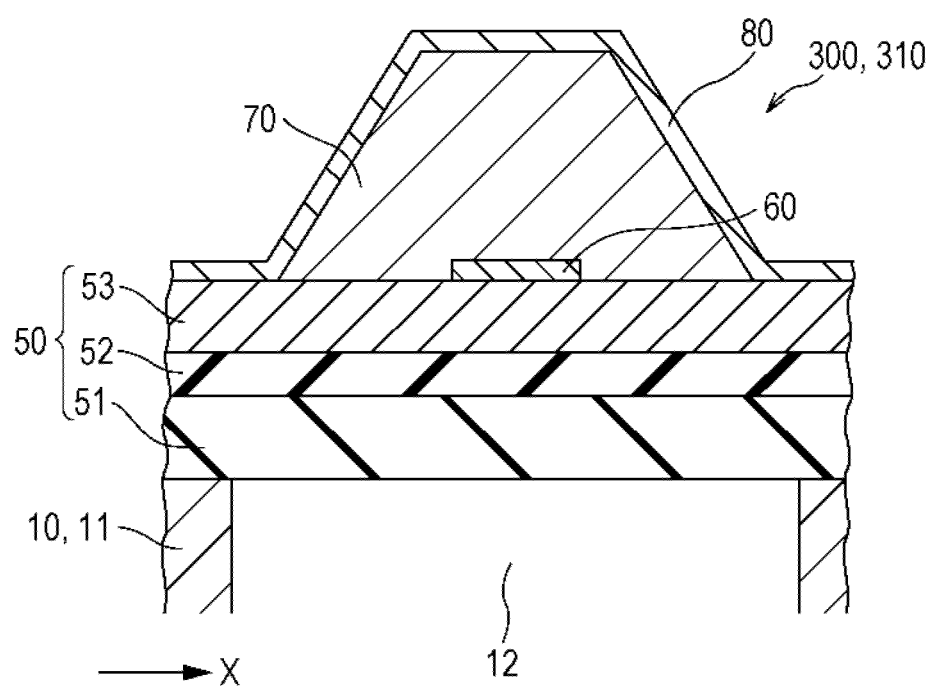

LIQUID EJECTING HEAD, LIQUID EJECTING APPARATUS, PIEZOELECTRIC ELEMENT, ULTRASONIC TRANSDUCER, AND ULTRASONIC DEVICE

BACKGROUND

1. Technical Field

The present invention relates to a liquid ejecting head for ejecting a liquid from a nozzle orifice, a liquid ejecting apparatus, a piezoelectric element, an ultrasonic transducer, and an ultrasonic device.

2. Related Art

Piezoelectric elements that are applied to liquid ejecting heads or ultrasonic transducers each include a diaphragm disposed on a substrate, a first electrode disposed on the diaphragm, a piezoelectric layer made of a piezoelectric material having an electromechanical conversion function, such as a crystallized dielectric material, disposed on the first electrode, and a second electrode disposed on the piezoelectric layer.

Some of such piezoelectric elements have a zirconium oxide ($ZrO_2$) layer as a part of the diaphragm. A method of forming the zirconium oxide layer included in a diaphragm by forming a zirconium layer by a gas-phase method such as sputtering and then thermally oxidizing the zirconium layer has been proposed (see, for example, JP-A-2005-176433).

However, the zirconium oxide layer formed by the gas-phase method has low adhesion with the film as its backing or with the film formed on the zirconium oxide layer, resulting in a reduction in reliability.

In addition, there is a risk of diffusion of components contained in a piezoelectric layer into a diaphragm and backing of the diaphragm to reduce the stiffness of the diaphragm and the backing.

Such a problem occurs not only in piezoelectric elements of ink jet recording heads and ultrasonic transducers but also in piezoelectric elements of other devices.

SUMMARY

An advantage of some aspects of the invention is to provide a liquid ejecting head, a liquid ejecting apparatus, a piezoelectric element, an ultrasonic transducer, and an ultrasonic device in which the diaphragms can be thickened and the adhesion is improved by inhibiting the diffusion of components contained in the piezoelectric layers.

An embodiment of the invention is a liquid ejecting head comprising a passage-forming substrate provided with a pressure-generating chamber communicating with a nozzle orifice for ejecting a liquid; and a piezoelectric element including a diaphragm disposed on the passage-forming substrate, a first electrode disposed on the diaphragm, a piezoelectric layer disposed on the first electrode, and a second electrode disposed on the piezoelectric layer, wherein the diaphragm includes a metal oxide layer of a metal oxide formed by a gas-phase method and a zirconium oxide layer of zirconium oxide formed by a liquid-phase method.

In this embodiment, the thickness of the diaphragm can be easily increased with the metal oxide layer. In addition, the zirconium oxide layer has high adhesion with the films on the upper and lower surfaces of the zirconium oxide layer. Furthermore, the zirconium oxide layer functions as a diffusion-preventing layer for inhibiting diffusion of components contained in the piezoelectric layer. Accordingly, the components of the piezoelectric layer are inhibited from diffusing to the backing disposed on the opposite side to the piezoelectric layer side of the zirconium oxide layer.

The zirconium oxide layer is preferably disposed on the passage-forming substrate side. In such a case, high adhesion of the zirconium oxide layer with the passage-forming substrate side is achieved.

The zirconium oxide layer is preferably disposed on the piezoelectric layer side. In such a case, high adhesion of the zirconium oxide layer with the piezoelectric layer and the first electrode is achieved, and the zirconium oxide layer also inhibits components contained in the piezoelectric layer from diffusing into the entire diaphragm.

The zirconium oxide layer is preferably disposed between the two metal oxide layers. In such a case, the diaphragm is further thickened, and the adhesion of the two metal oxide layers can be increased.

The diaphragm may further include an oxide layer, formed of an oxide of a material different from the metal oxide, on the passage-forming substrate side.

The metal oxide may be at least one selected from the group consisting of titanium oxide, yttria-stabilized zirconia, and aluminum oxide.

Another embodiment of the invention is a liquid ejecting apparatus including the liquid ejecting head according to the embodiment described above.

In this embodiment, destruction such delamination is inhibited to improve the reliability of the liquid ejecting apparatus.

Another embodiment of the invention is a piezoelectric element comprising a diaphragm, a first electrode disposed on the diaphragm, a piezoelectric layer disposed on the first electrode, and a second electrode disposed on the piezoelectric layer. The diaphragm includes a metal oxide layer of a metal oxide formed by a gas-phase method and a zirconium oxide layer of zirconium oxide formed by a liquid-phase method.

In this embodiment, the thickness of the diaphragm can be easily increased with the metal oxide layer. In addition, the zirconium oxide layer has high adhesion with the films on the upper and lower surfaces of the zirconium oxide layer. Furthermore, the zirconium oxide layer functions as a diffusion-preventing layer for inhibiting diffusion of components contained in the piezoelectric layer. Accordingly, the components of the piezoelectric layer are inhibited from diffusing to the backing disposed on the opposite side to the piezoelectric layer side of the zirconium oxide layer.

Another embodiment of the invention is an ultrasonic transducer including the piezoelectric element according to the embodiment described above.

In this embodiment, the thickness of the diaphragm can be easily increased with the metal oxide layer to allow high-frequency drive.

Another embodiment of the invention is an ultrasonic device including a substrate having an orifice and an ultrasonic transducer according to the embodiment described above disposed on the substrate.

In this embodiment, the ultrasonic device can be driven at a high frequency.

BRIEF DESCRIPTION OF THE DRAWINGS

The invention will be described with reference to the accompanying drawings, wherein like numbers reference like elements.

FIG. 3 is an enlarged cross-sectional view of a main portion of the recording head according to Embodiment 1 of the invention.

DESCRIPTION OF EXEMPLARY EMBODIMENTS

The invention will now be described in detail by embodiments.

Embodiment 1

Figure 1:
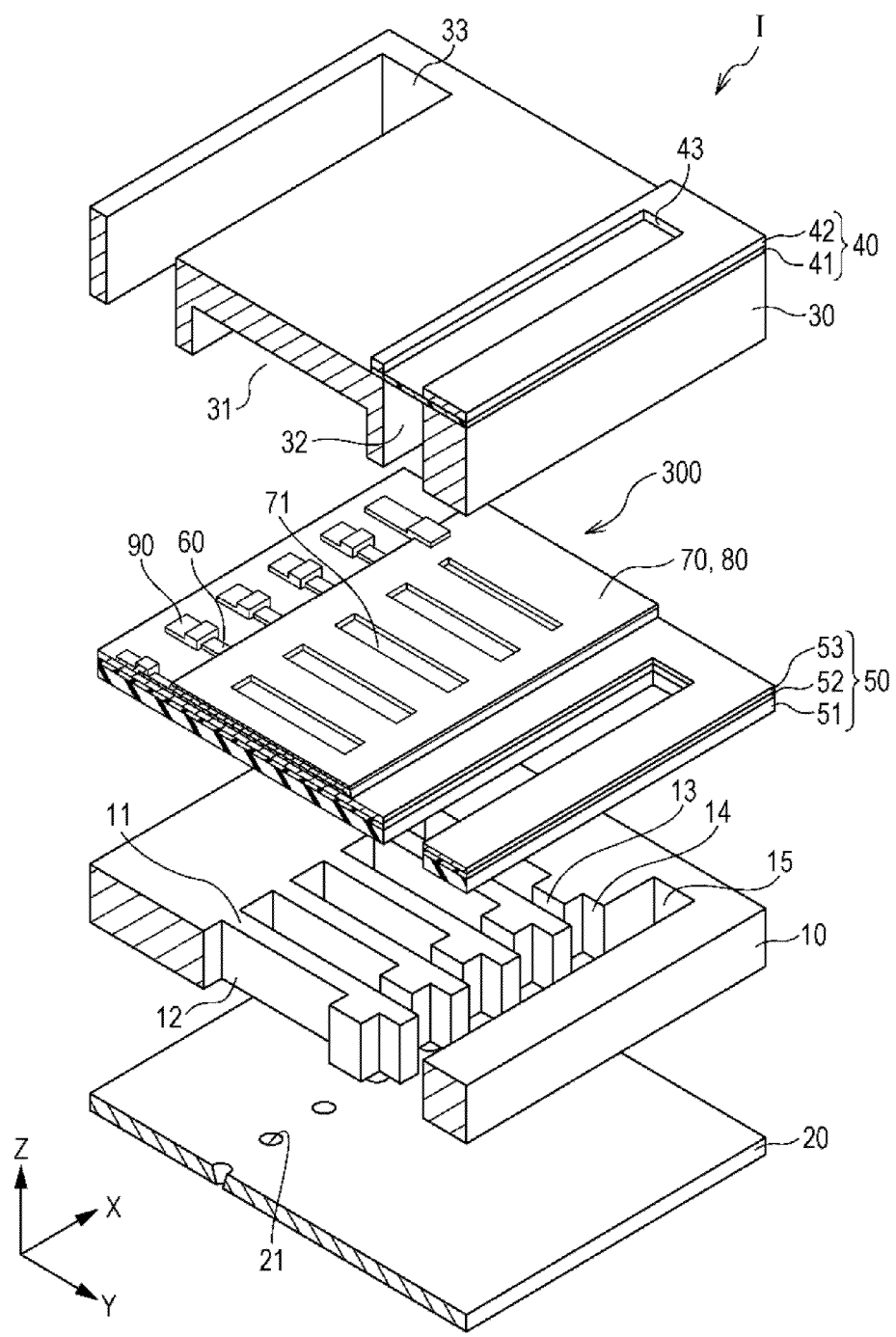
FIG. 1 is an exploded perspective view of a recording head according to Embodiment 1 of the invention.
Figure 2A:
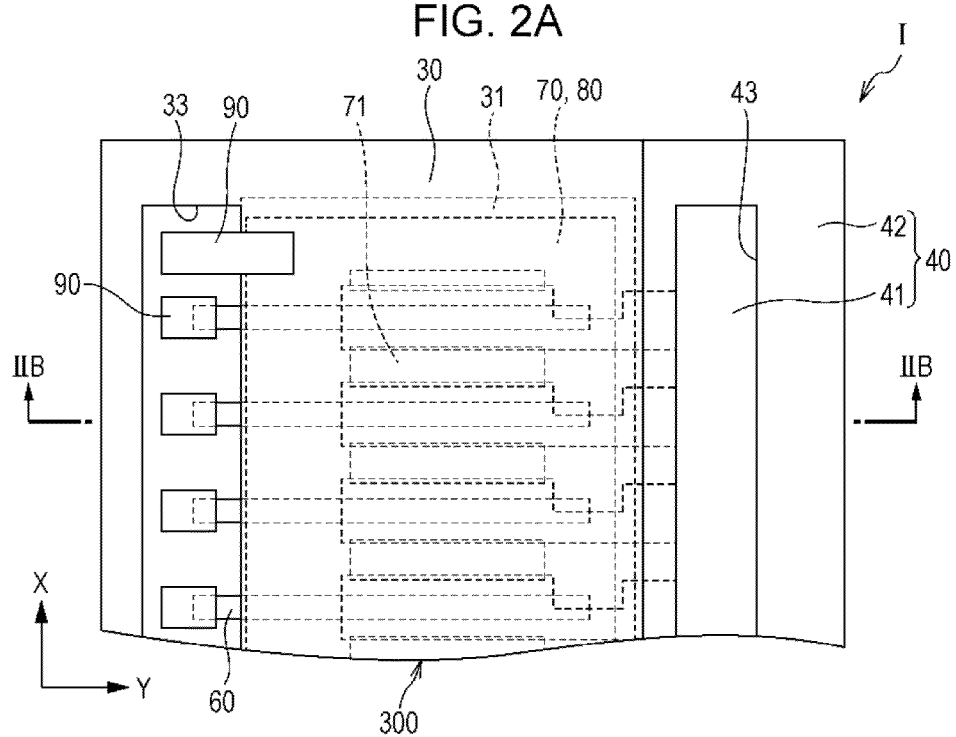
FIG. 2A is a plan view of the recording head according to Embodiment 1 of the invention.
Figure 2B:
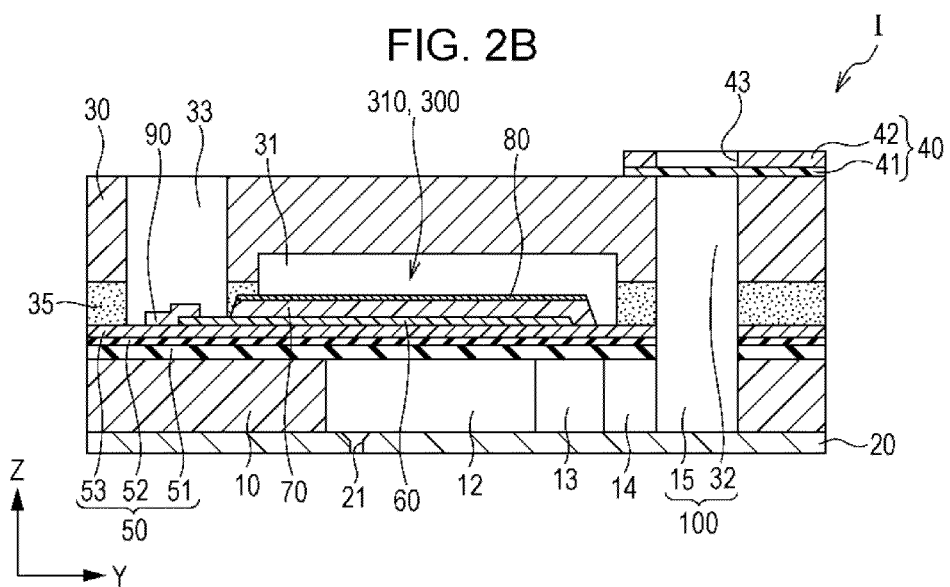
FIG. 2B is a cross-sectional view of the recording head shown in FIG. 2A, taken along the line IIB-IIB.

FIG. 1 is an exploded perspective view of an ink jet recording head, an example of the liquid ejecting head according to Embodiment 1 of the present invention. FIG. 2A is a plan view of the ink jet recording head, and FIG. 2B is a cross-sectional view of the recording head, taken along the line IIB-IIB. FIG. 3 is an enlarged cross-sectional view of a main portion, taken along the first direction X.

As shown in the drawings, the passage-forming substrate 10 of the ink jet recording head I as an example of the liquid ejecting head of this embodiment is provided with pressure-generating chambers 12. The pressure-generating chambers 12 partitioned with a plurality of partition walls 11 are juxtaposed in the direction along which a plurality of nozzle orifices 21 for discharging ink of the same color is disposed in a line. Hereinafter, this direction is called juxtaposition direction of the pressure-generating chambers 12 or first direction X. The passage-forming substrate 10 is provided with a plurality of lines, two lines in this embodiment, of the pressure-generating chambers 12 juxtaposed in the first direction X. The direction in which a plurality of lines of the pressure-generating chambers 12 formed along the first direction X is arranged is called second direction Y, hereinafter.

At one end side of the passage-forming substrate 10 in the longitudinal direction of the pressure-generating chamber 12, i.e., at one end side of the second direction Y orthogonal to the first direction X, ink-supplying paths 13 and communicating paths 14 are partitioned with a plurality of partition walls 11. On the outer side of the communicating paths 14 (on the opposite side to the pressure-generating chamber 12 side in the second direction Y), a communicating portion 15 partially constituting a manifold 100 serving as a common ink chamber (liquid chamber) for all the pressure-generating chambers 12 is provided. That is, the passage-forming substrate 10 is provided with a liquid passage composed of the pressure-generating chambers 12, the ink-supplying paths 13, the communicating paths 14, and the communicating portion 15.

One surface of the passage-forming substrate 10, i.e., the surface on which the liquid passage such as the pressure-generating chambers 12 are opened, is bonded to a nozzle plate 20 with, for example, an adhesive or a thermal adhesive film. The nozzle plate 20 is perforated with nozzle orifices 21 in communication with the respective pressure-generating chambers 12. That is, the nozzle plate 20 is provided with nozzle orifices 21 arranged in a line in the first direction X.

On the other surface of the passage-forming substrate 10, a diaphragm 50 is disposed. As shown in FIG. 3, the diaphragm 50 according to this embodiment includes an oxide layer 51 of an oxide formed on the passage-forming substrate 10, a zirconium oxide layer 52 of zirconium oxide ($ZrO_X$) formed by a liquid-phase method on the oxide layer 51, and a metal oxide layer 53 of a metal oxide formed by a gas-phase method on the zirconium oxide layer 52.

The oxide layer 51 is made of, for example, silicon dioxide ($SiO_2$) or silicon nitride ($Si_3N_4$). In this embodiment, the liquid passage such as the pressure-generating chambers 12 is formed by anisotropic etching from one surface side of the passage-forming substrate 10. On the other surface side of the passage-forming substrate 10, the oxide layer 51 is disposed to constitute the liquid passage such as the pressure-generating chambers 12. Accordingly, the passage-forming substrate 10 side of the diaphragm 50 is required to withstand the temperature (generally 500° C. or more) during the formation of a piezoelectric layer 70 and is also required to function as an etching stop layer. For example, when a silicon wafer is used as the passage-forming substrate 10 and when the passage such as the pressure-generating chambers 12 is formed by anisotropic etching by potassium hydroxide (KOH), the diaphragm (in a laminate, the silicon wafer side of the diaphragm) must function as an etching layer. Accordingly, the oxide layer 51 is preferably made of silicon oxide. Alternatively, the zirconium oxide layer 52 may be directly disposed on the passage-forming substrate 10 without disposing the oxide layer 51, depending on the shape or the method of producing the passage.

The zirconium oxide layer 52 is made of zirconium oxide ($ZrO_2$) formed by a liquid-phase method on the oxide layer 51. That is, the diaphragm 50 is provided with a zirconium oxide layer 52 made of zirconium oxide ($ZrO_2$) formed by a liquid-phase method on the substrate (passage-forming substrate 10) side.

The zirconium oxide layer 52 formed by the liquid-phase method is significantly compact compared to a zirconium oxide layer formed by a gas-phase method and has high adhesion with the backing (oxide layer 51) and the layer (metal oxide layer 53) formed thereon.

The crystal state of the zirconium oxide layer 52 of zirconium oxide formed by the liquid-phase method may be a granular form or a columnar or column-like form. The granular crystal form forms a compact zirconium oxide layer compared to the other form and is therefore preferred from the viewpoint of adhesion.

The metal oxide layer 53 is made of a metal oxide formed by a gas-phase method, such as sputtering or chemical vapor deposition (CVD), on the zirconium oxide layer 52. In this embodiment, first electrodes 60 disposed on the diaphragm 50 side are electrically independent individual electrodes for the respective active portions, which will be described in detail below. Accordingly, if a plurality of active portions is electrically connected by the diaphragm 50, the piezoelectric element 300 cannot be driven. Therefore, the metal oxide layer 53 is preferably made of a material having electrical insulating properties. The metal oxide layer 53 may be made of any metal oxide material having electrical insulating properties. Examples of the material include zirconium oxide ($ZrO_X$), titanium oxide ($TiO_X$), yttria-stabilized zirconia (YSZ), and aluminum oxide ($AlO_X$). In this embodiment, zirconium oxide ($ZrO_2$) is used as the metal oxide layer 53. The piezoelectric element comprising a diaphragm including the zirconium oxide layer 52 and the metal oxide layer 53 made of zirconium oxide can have displacement characteristics equivalent to those of a piezoelectric element 300 comprising a known diaphragm composed of an oxide layer and a metal oxide layer 53 formed by a gas-phase method only. That is, since the zirconium oxide layer 52 made of zirconium oxide formed by a liquid-phase method and the metal oxide layer 53 made of zirconium oxide formed by a gas-phase method are made of the same material and therefore have similar physical properties. Accordingly, even if the zirconium oxide layer 52 and the metal oxide layer 53 are laminated, the characteristics, e.g., the stiffness and toughness, thereof are equivalent to those of the metal oxide layer 53 only. Consequently, the use of the diaphragm 50 composed of the oxide layer 51, the zirconium oxide layer 52 made of zirconium oxide, and the metal oxide layer 53 made of zirconium oxide does not require modifying the design of the passage or each layer of the piezoelectric element 300 from that of a known piezoelectric element including a diaphragm composed of zirconium oxide and a metal oxide layer 53 only. As a result, the piezoelectric element 300 can be easily achieved.

The metal oxide layer 53 formed by the gas-phase method is in a columnar crystal form. The diaphragm 50 can have a large thickness by forming the metal oxide layer 53 by the gas-phase method. That is, since the gas-phase method can form a thick film easier than the liquid-phase method, the thickness of the diaphragm 50 having the metal oxide layer 53 formed by the gas-phase method can be easily increased compared to a diaphragm made of only a zirconium oxide layer 52 formed by the liquid-phase method. However, even if the gas-phase method is employed, an excessively large thickness roughens the surface of the diaphragm.

The diaphragm 50 composed of an oxide layer 51 disposed on the passage-forming substrate 10 side, a zirconium oxide layer 52 formed by a liquid-phase method on the oxide layer 51, and a metal oxide layer 53 formed by a gas-phase method on the zirconium oxide layer 52 can have a large thickness and can inhibit delamination by the high adhesion between the zirconium oxide layer 52 and the oxide layer 51 and between the zirconium oxide layer 52 and the metal oxide layer 53.

In addition, the zirconium oxide layer 52 can inhibit diffusion of components, such as lead (Pb) and bismuth (Bi), contained in a piezoelectric layer 70, of which details are given below, into layers below than the zirconium oxide layer 52, i.e., diffusion towards the passage-forming substrate 10 side. That is, the zirconium oxide layer 52 inhibits the components contained in the piezoelectric layer 70 from diffusing into the oxide layer 51 and the passage-forming substrate 10 to inhibit disadvantages, such as a reduction in stiffness, by diffusion of the components of the piezoelectric layer 70 into the oxide layer 51 and the passage-forming substrate 10. In this embodiment, since zirconium oxide formed by the gas-phase method is employed as the metal oxide layer 53, the metal oxide layer 53 also functions as a diffusion-preventing layer for inhibiting the components of the piezoelectric layer 70 from diffusing towards the passage-forming substrate 10 side.

Figure 4A:
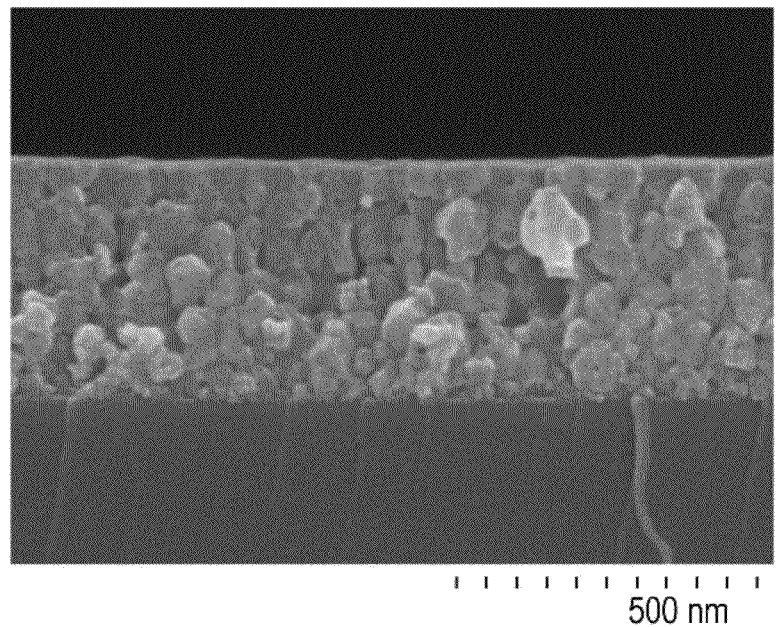
FIG. 4A is an SEM image of zirconium oxide according to Embodiment 1 of the invention.
Figure 4B:
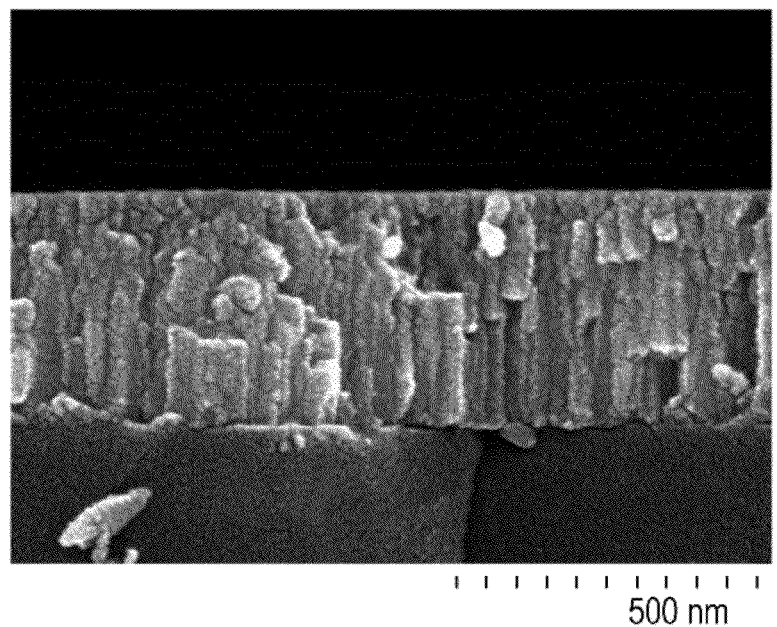
FIG. 4B is an SEM image of another zirconium oxide according to Embodiment 1 of the invention.

FIGS. 4A and 4B show the surfaces of zirconium oxide formed by the liquid-phase method and zirconium oxide formed by the gas-phase method observed with a scanning electron microscope (SEM).

As shown in FIG. 4A, the zirconium oxide formed by the liquid-phase method is in a granular crystal form, whereas as shown in FIG. 4B, the zirconium oxide formed by the gas-phase method is in a columnar crystal form formed from the backing side towards the piezoelectric layer 70 side.

Figure 5A:
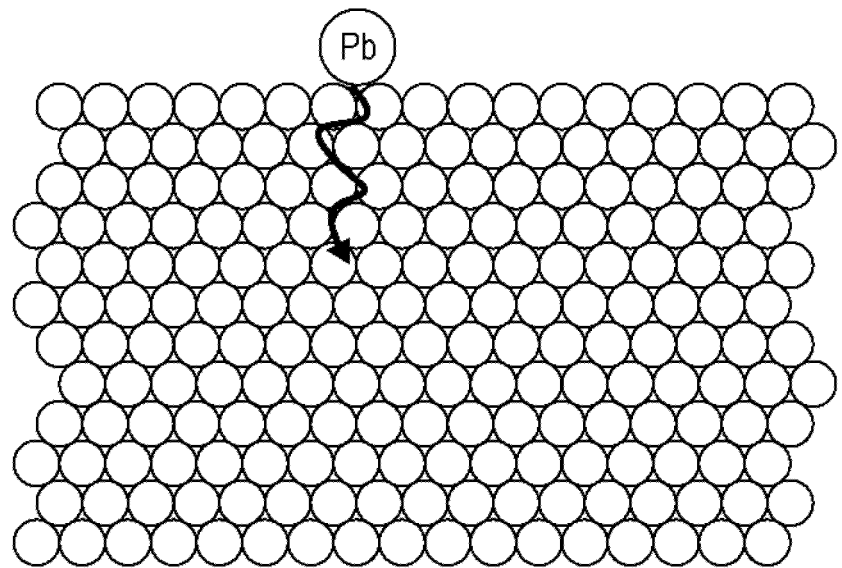
FIG. 5A is a diagram illustrating diffusion of zirconium oxide according to Embodiment 1 of the invention.

Accordingly, as shown in FIG. 5A, in the zirconium oxide having the granular crystal structure formed by the liquid-phase method, the components, such as lead and bismuth, contained in the piezoelectric layer 70 must pass through the complicated grain boundaries, resulting in a difficulty in diffusion compared to the zirconium oxide in a columnar crystal form.

Figure 5B:
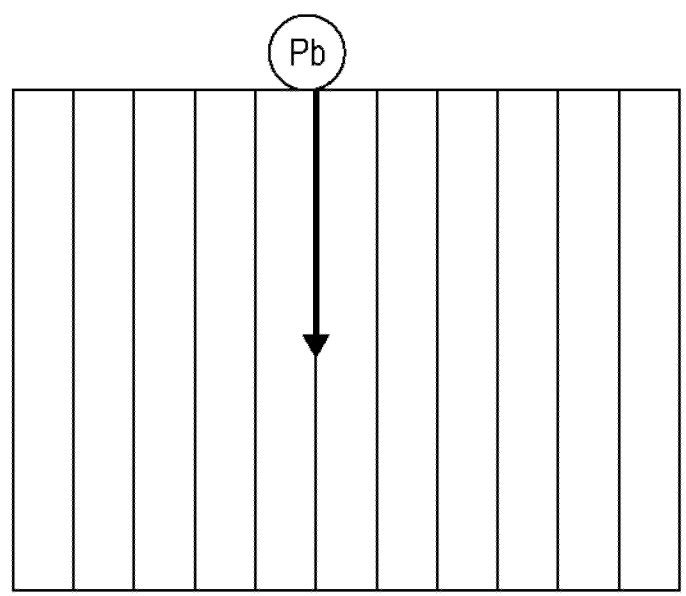
FIG. 5B is a diagram illustrating diffusion of zirconium oxide according to Embodiment 1 of the invention.

In the contrary, as shown in FIG. 5B, in the zirconium oxide having the columnar crystal structure formed by the gas-phase method, the components, such as lead and bismuth, contained in the piezoelectric layer 70 tend to diffuse towards the backing side (passage-forming substrate 10 side) through boundaries formed in a relatively linear form and therefore easily diffuse compared to the zirconium oxide having the granular crystal structure. The zirconium oxide having the columnar crystal structure can also inhibit the components contained in the piezoelectric layer 70 from diffusing, but the zirconium oxide having the granular crystal structure is superior as a diffusion-preventing layer.

In the diaphragm 50 including the zirconium oxide layer 52 of zirconium oxide formed by the liquid-phase method on the passage-forming substrate 10 side, the zirconium oxide layer 52 has high adhesion with the oxide layer 51 as the backing for the zirconium oxide layer 52 and with the metal oxide layer 53, resulting in inhibition of delamination.

The adhesion of zirconium oxide to silicon oxide was measured with a scratch tester using zirconium oxide formed by the liquid-phase method on silicon oxide and zirconium oxide formed by the gas-phase method on silicon oxide.

The results were that the adhesion of the zirconium oxide formed by the gas-phase method was 300 to 600 mN, whereas the zirconium oxide formed by the liquid-phase method was 1000 mN (measurement limit) or more. The results demonstrate that the liquid-phase method forms chemical bonds between silicon oxide and zirconium oxide, resulting in a high adhesive strength.

Accordingly, the zirconium oxide layer 52 made of zirconium oxide formed by the liquid-phase method has high adhesion with the oxide layer 51 as the backing of the zirconium oxide layer 52 to inhibit disadvantages such as delamination. In addition, the adhesion between the zirconium oxide layer 52 and the metal oxide layer 53 of zirconium oxide formed by the gas-phase method on the zirconium oxide layer 52 is also high to inhibit disadvantages such as delamination between the zirconium oxide layer 52 and the metal oxide layer 53.

Above the diaphragm 50, a first electrode 60, a piezoelectric layer 70, and a second electrode 80 are formed. In this embodiment, the diaphragm 50, the first electrode 60, the piezoelectric layer 70, and the second electrode 80 constitute a piezoelectric element 300. The deformable piezoelectric element 300 disposed on a substrate (passage-forming substrate 10) constitutes a piezoelectric actuator of this embodiment.

The first electrode 60 constituting the piezoelectric element 300 is cut so as to correspond to the respective pressure-generating chambers 12 and to be electrically independent individual electrodes for the respective active portions 310. Each first electrode 60 has a width in the first direction X narrower than that of the pressure-generating chamber 12. That is, in the first direction X of the pressure-generating chamber 12, the end portions of the first electrode 60 are positioned inside the region facing the pressure-generating chamber 12. In the second direction Y, both end portions of the first electrode 60 extend to the outside of the pressure-generating chamber 12. The first electrode 60 is required to be made of a material that is not oxidized during the formation of the piezoelectric layer 70, which is described below, to maintain the electric conductivity and is preferably made of, for example, a precious metal, such as platinum (Pt) or iridium (Ir), or an electrically conductive oxide represented by lanthanum nickel oxide (LNO).

As the first electrode 60, an adhesion layer for securing sufficient adhesion between any of the above-mentioned electric conductive materials and the diaphragm 50 may be provided. In this embodiment, titanium (not shown) is used in the adhesion layer. The adhesion layer can be formed of, for example, zirconium, titanium, or titanium oxide. That is, in this embodiment, an adhesion layer made of titanium and a conductive layer made of at least one selected from the above-mentioned electric conductive materials constitute the first electrode 60.

The piezoelectric layer 70 is disposed in successive in the first direction X with a certain width in the second direction Y. The width of the piezoelectric layer 70 in the second direction Y is wider than the length of the pressure-generating chamber 12 in the second direction Y. The piezoelectric layer 70 extends to the outside of the pressure-generating chamber 12 in the second direction Y.

One end portion (in this embodiment, the ink-supplying path side) of the piezoelectric layer 70 in the second direction of the pressure-generating chamber 12 extends to the outer side than the end portion of the first electrode 60. That is, one end of the first electrode 60 is covered with the piezoelectric layer 70. The other end portion of the piezoelectric layer 70 in the second direction Y of the pressure-generating chamber 12 is positioned at the inner side (pressure-generating chamber 12 side) than the end portion of the first electrode 60.

The first electrode 60 extending to the outside of the piezoelectric layer 70 is connected with a lead electrode 50 made of, for example, gold (Au). This lead electrode 90 constitutes a terminal (not shown) connected to connecting wiring for a driving circuit, for example.

The piezoelectric layer 70 is provided with concaves 71 facing the partition walls 11. The width of each concave 71 in the first direction X is approximately the same as or wider than the width of the partition wall 11. As a result, the stiffness of the diaphragm 50 in the portion facing the end portion of the pressure-generating chamber 12 in the width direction (i.e., the arm portion of the diaphragm 50) can be suppressed to allow sufficient deformation of the piezoelectric element 300.

The piezoelectric layer 70 is formed on the first electrode 60 and is, for example, a crystal film having a perovskite structure (perovskite crystals) made of a ferroelectric ceramic material showing an electromechanical conversion action. The piezoelectric layer 70 can be formed of a material containing lead (Pb), titanium (Ti), and zirconium (Zr), such as lead zirconate titanate (PZT) or a mixture thereof with a metal oxide such as niobium oxide, nickel oxide, or magnesium oxide. Examples of the material include lead titanate ($PbTiO_3$), lead zirconate titanate ($Pb(Zr,Ti)O_3$), lead zirconate ($PbZrO_3$), lead lanthanum titanate (($Pb,La$), $TiO_3$), lead lanthanum zirconate titanate (($Pb,La$)($Zr,Ti$)$O_3$), and lead magnesium niobate zirconium titanate ($Pb(Zr,Ti)(Mg,Nb)O_3$). In this embodiment, lead zirconate titanate (PZT) is used as the piezoelectric layer 70.

The piezoelectric layer 70 may be formed of a lead-free piezoelectric material, such as a complex oxide having a perovskite structure containing bismuth ferrate or bismuth ferrate manganate and barium titanate or bismuth potassium titanate.

The piezoelectric layer 70 can be formed by a liquid-phase method, such as a sol-gel method or metal-organic decomposition (MOD), or a gas-phase method (physical vapor deposition: PVD), such as sputtering or laser ablation, of which details are given below. In this embodiment, the internal stress during formation of the piezoelectric layer 70 is tensile stress.

The second electrode 80 is disposed on the opposite side to the first electrode 60 side of the piezoelectric layer 70 and constitutes a common electrode for a plurality of active portions 310.

The material for the second electrode 80 is desirably a material that can sufficiently form an interface with the piezoelectric layer 70 and has electrical insulating properties and piezoelectric properties. The material is preferably, for example, a precious metal, such as iridium (Ir), platinum (Pt), palladium (Pd), or gold (Au), or an electrically conductive oxide represented by lanthanum nickel oxide (LNO). The second electrode 80 may be a laminate of a plurality of materials. The second electrode 80 can be formed by a gas-phase method (physical vapor deposition: PVD), such as sputtering or laser ablation, or a liquid-phase method, such as a sol-gel method, metal-organic decomposition (MOD), or plating.

The second electrode 80 is disposed so as to continuously cover the surface of the piezoelectric layer 70 on the opposite side to the first electrode 60 side, inner surfaces of the concaves 71, i.e., the side surfaces of the piezoelectric layer 70, and the diaphragm 50.

One end portion (ink-supplying path side) of the second electrode 80 in the second direction Y of the pressure-generating chamber 12 is positioned at the inner side (pressure-generating chamber 12 side) than the end portion of the piezoelectric layer 70. That is, the end of the piezoelectric layer 70 in the second direction Y projects to the outside of the second electrode 80.

The piezoelectric element 300 having such a structure deforms by application of a voltage between the first electrode 60 and the second electrode 80. That is, application of a voltage between the electrodes 60 and 80 generates piezoelectric strain in the piezoelectric layer 70 between the first electrode 60 and the second electrode 80. The region where the piezoelectric strain occurs in the piezoelectric layer 70 by the application of a voltage between the electrodes 60 and 80 is called an active portion 310, whereas the region where the piezoelectric strain does not occur in the piezoelectric layer 70 is called a non-active portion. In the active portion 310 where piezoelectric strain occurs in the piezoelectric layer 70, a region facing the pressure-generating chamber 12 is called a flexible portion, whereas the region outside the pressure-generating chamber 12 is called non-flexible portion.

In this embodiment, all of the first electrodes 60, the piezoelectric layer 70, and the second electrode 80 are disposed so as to continuously extend to the outside of the pressure-generating chambers 12 in the second direction Y of the pressure-generating chamber 12. That is, the active portion 310 is continuously provided to reach the outside of the pressure-generating chamber 12. Consequently, in the active portion 310, the region facing the pressure-generating chamber 12 of the piezoelectric element 300 is the flexible portion, and the region outside the pressure-generating chamber 12 is the non-flexible portion.

In this embodiment, as shown in FIGS. 2A and 2B, the ends of the active portion 310 in the second direction Y are defined by the second electrode 80 and are present at the outside of the region facing the pressure-generating chamber 12, i.e., in the non-flexible portion.

On the outside of the active portion 310 in the second direction Y, in this embodiment, on the opposite side to the ink-supplying path 13 side, a non-active portion where the second electrode 80 is not provided is disposed.

In such a piezoelectric element 300, since the second electrode 80 covers the piezoelectric layer 70, a current does not leak between the first electrode 60 and the second electrode 80, and the destruction of the piezoelectric element 300 is inhibited. If the first electrode 60 and the second electrode 80 are exposed in an adjacent state, a current leaks on the surface of the piezoelectric layer 70 to destroy the piezoelectric layer 70. Even if the first electrode 60 and the second electrode 80 are exposed, current leakage does not occur as long as the distance between them is not small.

As shown in FIGS. 1, 2A, and 2B, the passage-forming substrate 10 provided with the piezoelectric element 300 is bonded to a protective substrate 30 for protecting the piezoelectric element 300 with an adhesive 35.

The protective substrate 30 is provided with a piezoelectric element-holding portion 31, which is a concave for dividing a space for receiving the piezoelectric element 300. The protective substrate 30 is also provided with a manifold portion 32 constituting a part of the manifold 100. The manifold portion 32 is formed along the width direction of the pressure-generating chamber 12 so as to pass through the protective substrate 30 in the thickness direction. As described above, the manifold portion 32 is communicated with the communicating portion 15 of the passage-forming substrate 10. The protective substrate 30 is further provided with a through-hole 33 passing through the protective substrate 30 in the thickness direction. The lead electrode 90 connected to the first electrode 60 of each active portion 310 is exposed inside the through-hole 33 and is connected to an end of connecting wiring, which is connected to a driving circuit (not shown), in the through-hole 33.

On the protective substrate 30, a compliance substrate 40 composed of a sealing film 41 and a fixing plate 42 is bonded. The sealing film 41 is made of a flexible material having a low stiffness and seals one side of the manifold portion 32. The fixing plate 42 is made of a relatively hard material such as a metal. The fixing plate 42 is provided with an opening 43 at the area facing the manifold 100 by completely removing the fixing plate 42 in the thickness direction. Therefore, the one side of the manifold 100 is sealed with only the sealing film 41 having flexibility.

In such an ink jet recoding head I of the embodiment, ink is fed through an ink inlet connected to exterior ink supplying means (not shown) to fill the inside from the manifold 100 to the nozzle orifices 21 with ink. Then, a voltage is applied between the first electrode 60 and the second electrode 80 corresponding to each pressure-generating chamber 12 according to a recording signal from the driving circuit. Thereby, the diaphragm 50 flexurally deforms together with the piezoelectric element 300 to increase the pressure inside the pressure-generating chamber 12 and thereby eject ink droplets from each nozzle orifice 21.

A method of producing the ink jet recording head of the embodiment will be described. FIGS. 6A to 6D, 7A to 7C, 8A, 8B, and 9A to 9C are cross-sectional views illustrating a method of producing the ink jet recording head.

Figure 6A:
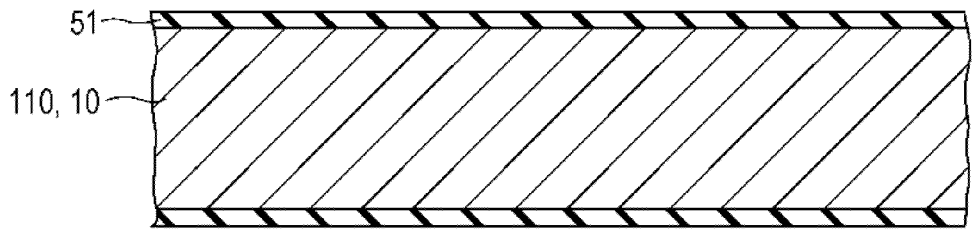
FIG. 6A is a cross-sectional view illustrating a step of a method of producing the recording head according to Embodiment 1 of the invention.

A diaphragm 50 is formed on a surface of a silicon wafer as the passage-forming substrate wafer 110. Specifically, as shown in FIG. 6A, an oxide layer 51 of a silicon dioxide is formed by thermal oxidation of the passage-forming substrate wafer 110.

Figure 6B:
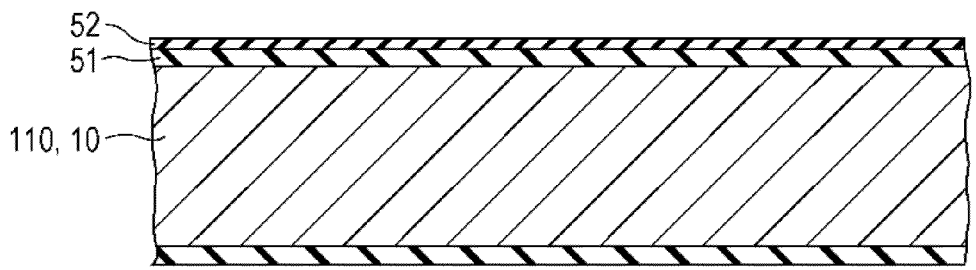
FIG. 6B is a cross-sectional view illustrating a step of the method of producing the recording head according to Embodiment 1 of the invention.

Subsequently, as shown in FIG. 6B, a zirconium oxide layer 52 of zirconium oxide ($ZrO_x$) is formed by a liquid-phase method on the oxide layer 51.

More specifically, a metal alkoxide or metal carboxylate and a thickener are added to carboxylic acid, and then water ($H_2O$) is added thereto, followed by heating at about 70° C. for about 2 hours with stirring to give a uniform transparent precursor solution. This precursor solution is spin-coated onto the substrate at a rotational speed of 1400 rpm (application step). The solution applied to the substrate is heated at 160° C. to 200° C. for about 5 minutes to give a dry film (drying step). This dry film is degreased by heating the film at 375° C. to 415° C. for about 5 minutes (decreasing step). The degreasing herein means that organic components contained in the dry film are eliminated as, for example, $NO_2$, $CO_2$, or $H_2O$. In order to prepare a zirconium oxide layer 52 having a larger thickness, the application step, the drying step, and the decreasing step may be repeated. After the decreasing step, the dry film is heated at 750° C. to 850° C. for about 10 seconds to 3 minutes for crystallization (pre-firing step). In the pre-firing step, a long heating time makes etching impossible due to roughness of the surface and occurrence of voids of the firing interface. Accordingly, the period of time of the pre-firing step is preferably as short as possible. In order to prepare a zirconium oxide layer 52 having a further large thickness, the application step, the drying step, the decreasing step, and the pre-firing step may be repeated. After the pre-firing step, the dry film is heated at 800° C. to 950° C. for about 1 hour to give a zirconium oxide layer 52 (main-firing step). As the heating apparatus used in the drying step, the degreasing step, the pre-firing step, and the main-firing step, for example, a rapid thermal annealing (RTA) apparatus performing heating by irradiation with an infrared lamp or a hot plate can be used.

The zirconium oxide layer 52 of zirconium oxide formed by the liquid-phase method has a columnar crystal structure as described above.

Figure 6C:
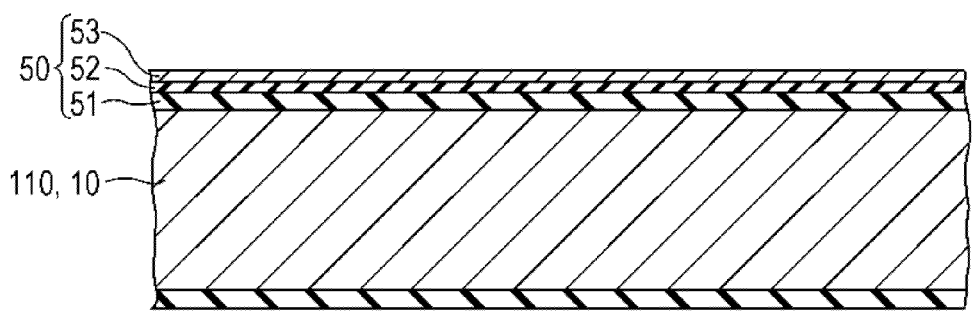
FIG. 6C is a cross-sectional view illustrating a step of the method of producing the recording head according to Embodiment 1 of the invention.
Figure 6D:
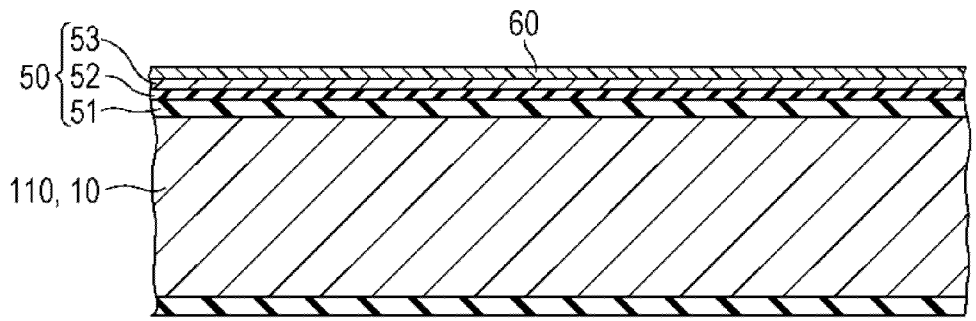
FIG. 6D is a cross-sectional view illustrating a step of the method of producing the recording head according to Embodiment 1 of the invention.

Subsequently, as shown in FIG. 6C, a metal oxide layer 53 is formed by a gas-phase method on the zirconium oxide layer 52. Specifically, a film is formed by sputtering of zirconium (Zr) and is heated at 800° C. for about 10 seconds for crystallization (pre-firing step). After the pre-firing step, the film is heated at 850° C. for about 1 hour to form a metal oxide layer 53 of zirconium oxide (main-firing step).

The metal oxide layer 53 of zirconium oxide formed by the gas-phase method has a columnar crystal structure.

As a result, a diaphragm 50 composed of the oxide layer 51, the zirconium oxide layer 52, and the metal oxide layer 53 laminated in this order from the passage-forming substrate 10 side (passage-forming substrate wafer 110 side) is formed. The thus-formed diaphragm 50 (in a case of a multilayer, the electrode forming side) needs to be an insulator and to be capable of withstanding the temperature (generally 500° C. or more) during the formation of a piezoelectric layer 70. The diaphragm (in a case of a multilayer, the silicon wafer side) also needs to function as an etching stop layer when a silicon wafer is used as the passage-forming substrate 10 and when the passage such as the pressure-generating chambers 12 is formed by anisotropic etching by potassium hydroxide (KOH). In a case of using silicon dioxide as a part of the diaphragm 50, if lead and bismuth contained in the piezoelectric layer 70 diffuse into the silicon dioxide portion, the silicon dioxide portion is deteriorated to cause delamination of the electrode and the piezoelectric layer 70 as the upper layers. Accordingly, a diffusion-preventing layer for silicon dioxide is necessary. In this embodiment, the zirconium oxide layer 52 and the metal oxide layer 53 function as diffusion-preventing layers. In particular, the zirconium oxide layer 52 of zirconium oxide formed by the liquid-phase method shows an excellent function as a diffusion-preventing layer to inhibit diffusion of the components, such as lead and bismuth, contained in the piezoelectric layer 70.

In the diaphragm 50 including a laminate of silicon dioxide and zirconium oxide as in this embodiment, each material withstands the temperature during the formation of the piezoelectric layer 70, silicon dioxide functions as an insulating layer and as an etching stop layer, and zirconium oxide functions as an insulating layer and as a diffusion-preventing layer. Such a diaphragm is most preferred.

Figure 7A:
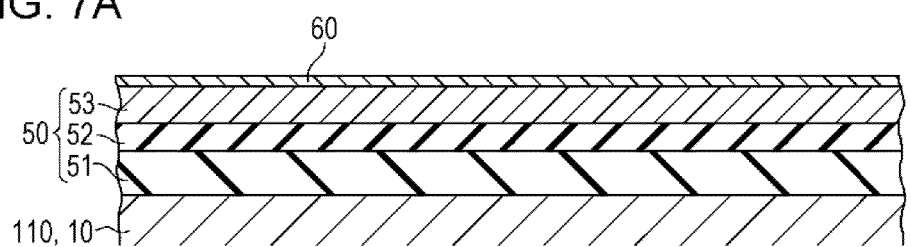
FIG. 7A is a cross-sectional view illustrating a step of the method of producing the recording head according to Embodiment 1 of the invention.

Subsequently, as shown in FIG. 7A, a first electrode 60 is formed on the entire surface of the diaphragm 50. The first electrode 60 may be formed of any material that does not lose electric conductivity by, for example, oxidation by the heat treatment (generally 500° C. or more) during the formation of the piezoelectric layer 70 or diffusion of materials contained in the piezoelectric layer 70. Accordingly, the material for the first electrode 60 is preferably a metal, such as platinum or iridium, an electrically conductive oxide, such as iridium oxide or lanthanum nickel oxide, or a laminate material of these materials, which do not lose electric conductivity even at high temperature. The first electrode 60 can be formed by, for example, a gas-phase film formation such as sputtering, physical vapor deposition (PVD), or laser ablation or liquid-phase film formation such as spin coating. An adhesion layer may be further disposed between the conductive material and the diaphragm 50 for securing sufficient adhesion. In this embodiment, titanium is used as the adhesion layer (not shown). Examples of the material for the adhesion layer include zirconium, titanium, and titanium oxide. The adhesion layer can be formed by a similar process to that used in the electrode material. A controlling layer for controlling the crystal growth of the piezoelectric layer 70 may be formed on the electrode surface (the piezoelectric layer 70 forming side). In this embodiment, titanium is used for controlling the crystallization of the piezoelectric layer (PZT) 70. Since titanium is incorporated into the piezoelectric layer 70 during the formation of the piezoelectric layer 70, titanium does not exist as a film after the formation of the piezoelectric layer 70. The crystal controlling layer may be formed of an electric conductive oxide having a perovskite crystal structure, such as lanthanum nickel oxide. The crystal controlling layer can be formed by a similar process to that used in the electrode material. The crystal controlling layer having electrical insulating properties desirably does not exist between the piezoelectric layer 70 and the first electrode 60 after the formation of the piezoelectric layer 70. If the crystal controlling layer remains, capacitors of the crystal controlling layer and the piezoelectric layer 70 are connected in series, resulting in a reduction of the electric field to be applied to the piezoelectric layer 70. Though heat treatment generally forms an oxide (insulator), in the use of titanium for the crystal controlling layer as in the embodiment, titanium is incorporated in the piezoelectric layer 70 and therefore does not exist as a film.

Subsequently, in this embodiment, a piezoelectric layer 70 made of lead zirconate titanate (PZT) is formed. In this embodiment, the piezoelectric layer 70 made of a metal oxide is formed by a sol-gel method by dissolving or dispersing a metal complex in a solvent to prepare a sol and then applying and drying the sol for gelation, followed by firing at high temperature. The piezoelectric layer 70 may be formed by a method other than the sol-gel method, for example, metal-organic decomposition (MOD), sputtering, or physical vapor deposition (PVD) such as laser ablation. That is, the piezoelectric layer 70 may be formed either a liquid-phase method or a gas-phase method. In this embodiment, the piezoelectric layer 70 is formed by laminating a plurality of piezoelectric films 74.

Figure 7B:
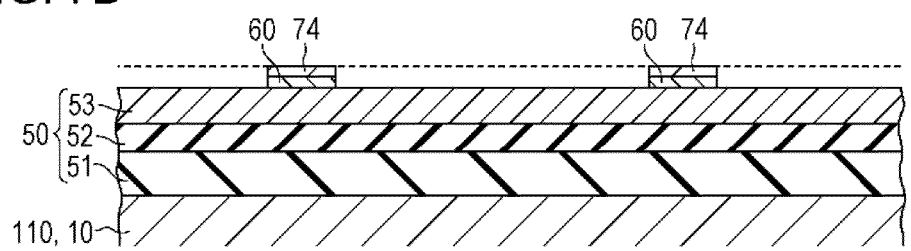
FIG. 7B is a cross-sectional view illustrating a step of the method of producing the recording head according to Embodiment 1 of the invention.

Specifically, as shown in FIG. 7B, a first piezoelectric film 74 is formed on the first electrode 60, and then the first electrode 60 and the first piezoelectric film 74 are simultaneously patterned. The first electrode 60 and the first piezoelectric film 74 can be patterned by, for example, dry etching such as reactive ion etching (RIE) or ion milling.

For example, if the first piezoelectric film 74 is formed after patterning of the first electrode 60, the first electrode 60 is patterned by photolithography, ion milling, and asking. As a result, the surface of the first electrode 60 and a seed crystal layer such as titanium (not shown) provided to the surface are deteriorated. If a piezoelectric film 74 is formed on the deteriorated surface, the crystalline properties of the piezoelectric film 74 become insufficient. The crystal growth of the second and subsequent piezoelectric films 74 is also affected by the crystal form of the first piezoelectric film 74, resulting in impossibility of formation of a piezoelectric layer 70 having satisfactory crystalline properties.

In the contrary, if the first piezoelectric film 74 and the first electrode 60 are simultaneously patterned after formation of the first piezoelectric film 74, the first piezoelectric film 74 serves as a seed for highly enhancing crystal growth of the second and subsequent piezoelectric films 74 compared to a seed crystal such as titanium. For example, even if a significantly thin damaged layer is formed on the surface layer by patterning, the layer does not highly affect the crystal growth of the second and subsequent piezoelectric films 74.

Before the formation of the second piezoelectric film 74, a crystal controlling layer (intermediate crystal controlling layer) may be formed on the exposed diaphragm 50 and may be used in the formation of the second and subsequent piezoelectric films 74. In this embodiment, titanium is used as the intermediate crystal controlling layer. The intermediate crystal controlling layer of titanium is incorporated into the piezoelectric film 74 during the formation of the piezoelectric film 74 as in titanium of the crystal controlling layer formed on the first electrode 60. If the intermediate crystal controlling layer remains and becomes an intermediate electrode or a dielectric of a capacitor connected in series, the piezoelectric properties are decreased. Accordingly, it is desirable that the intermediate crystal controlling layer be incorporated into the piezoelectric film 74 (piezoelectric layer 70) and do not remain as a film after the formation of the piezoelectric layer 70.

Figure 7C:
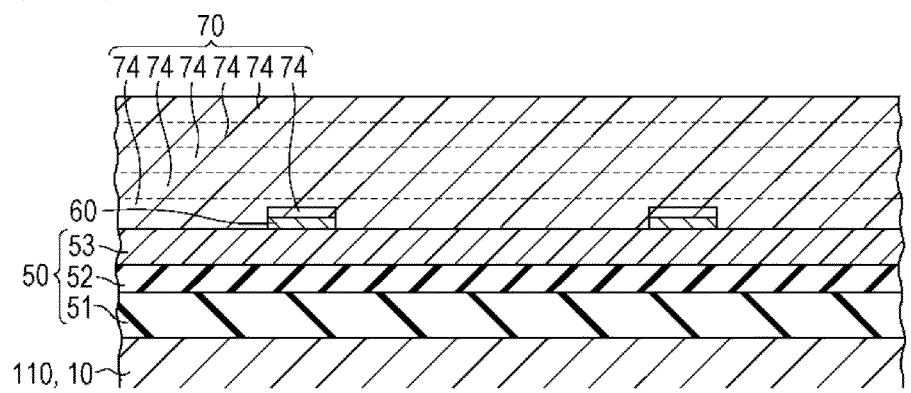
FIG. 7C is a cross-sectional view illustrating a step of the method of producing the recording head according to Embodiment 1 of the invention.

Subsequently, as shown in FIG. 7C, the second and subsequent piezoelectric films 74 are laminated to form a piezoelectric layer 70 composed of a plurality of piezoelectric films 74.

The second and subsequent piezoelectric films 74 are formed so as to continuously cover the exposed diaphragm 50, the side faces of each first electrode 60, and the first piezoelectric film 74.

Diffusion of the components, such as lead (Pb) and bismuth (Bi), contained in the piezoelectric layer 70 is inhibited by the zirconium oxide layer 52.

Figure 8A:
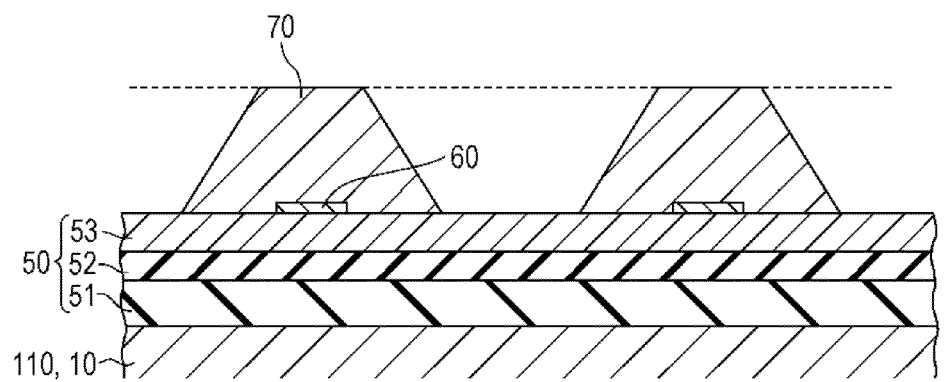
FIG. 8A is a cross-sectional view illustrating a step of the method of producing the recording head according to Embodiment 1 of the invention.

Subsequently, as shown in FIG. 8A, piezoelectric layer 70 is patterned so as to correspond to the pressure-generating chambers 12. In this embodiment, a mask (not shown) having a predetermined shape is provided on the piezoelectric layer 70, and the piezoelectric layer 70 is patterned through this mask by photolithography. The piezoelectric layer 70 may be patterned by, for example, dry etching, such as reactive ion etching (RIE) or ion milling, or wet etching using an etching solution.

Figure 8B:
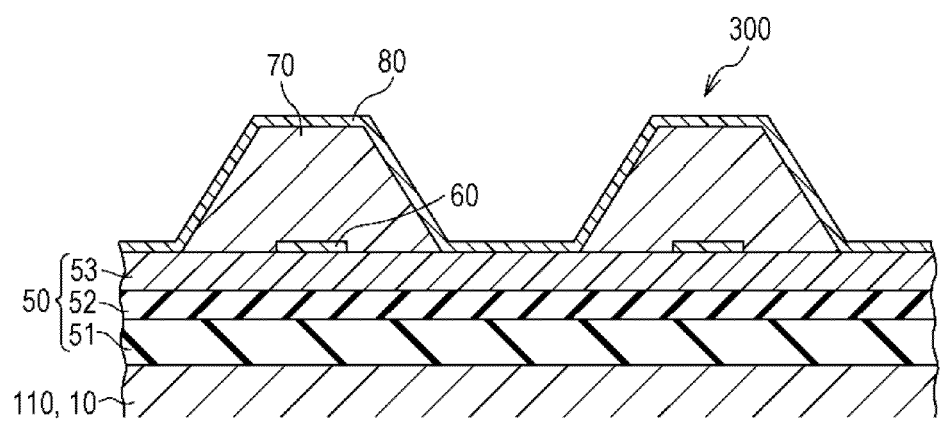
FIG. 8B is a cross-sectional view illustrating a step of the method of producing the recording head according to Embodiment 1 of the invention.

Subsequently, as shown FIG. 8B, a second electrode 80 is formed on one surface side of the passage-forming substrate wafer 110 (the surface side provided with the piezoelectric layer 70) so as to cover the patterned piezoelectric layer 70 and the exposed diaphragm 50.

Subsequently, a lead electrode 90 (not shown) is formed and is patterned into a predetermined shape (see FIGS. 2A and 2B).

Figure 9A:
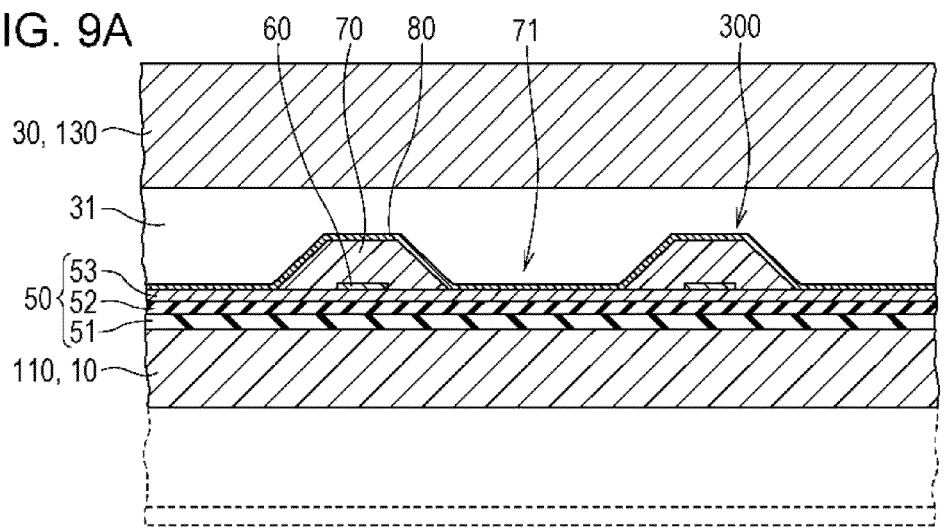
FIG. 9A is a cross-sectional view illustrating a step of the method of producing the recording head according to Embodiment 1 of the invention.

Subsequently, as shown in FIG. 9A, a protective substrate wafer 130 that is a silicon wafer for forming a plurality of protective substrates 30 is bonded to the passage-forming substrate wafer 110 on the piezoelectric elements 300 side with an adhesive 35 (see FIGS. 2A and 2B), and the passage-forming substrate wafer 110 is then thinned to a predetermined thickness.

Figure 9B:
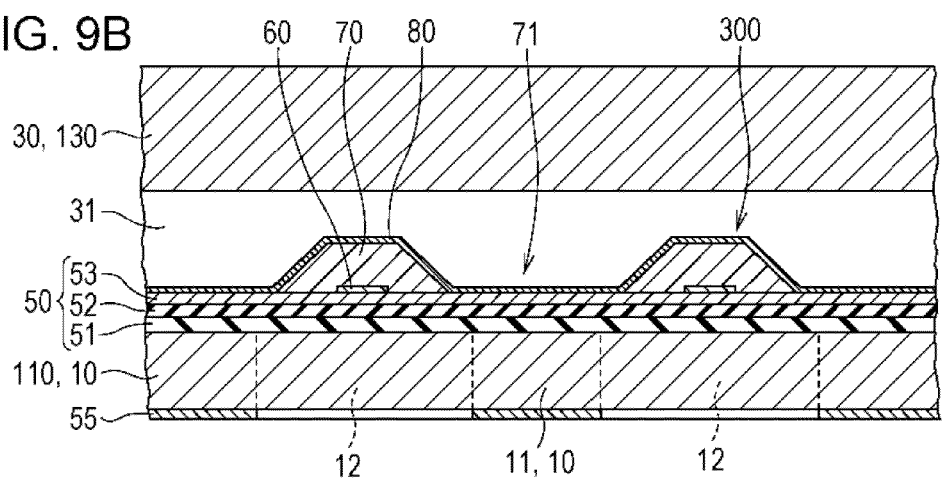
FIG. 9B is a cross-sectional view illustrating a step of the method of producing the recording head according to Embodiment 1 of the invention.
Figure 9C:
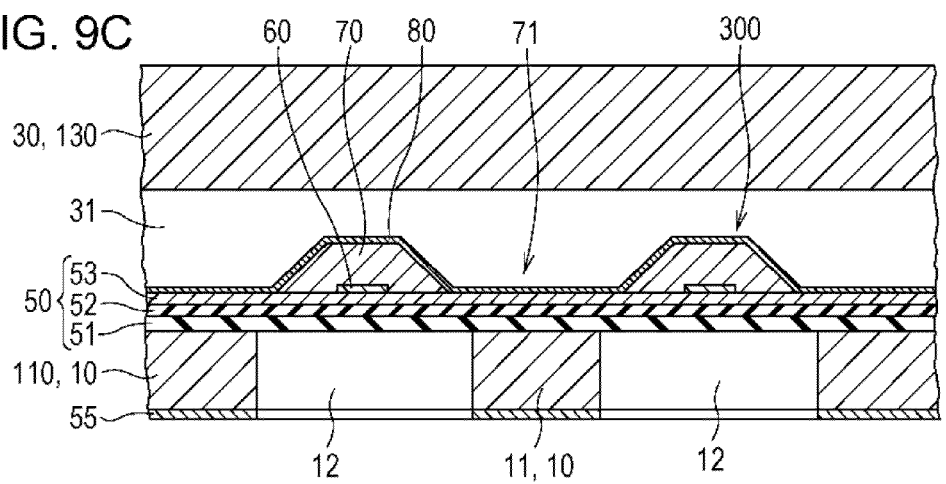
FIG. 9C is a cross-sectional view illustrating a step of the method of producing the recording head according to Embodiment 1 of the invention.

Subsequently, as shown in FIG. 9B, a mask film 55 is newly formed on the passage-forming substrate wafer 110 and patterned into a predetermined shape. Then, as shown in FIG. 9C, the passage-forming substrate wafer 110 is anisotropically etched (wet-etched) using an alkaline solution, such as KOH, through the mask film 55 to form pressure-generating chambers 12, ink-supplying paths 13, communicating paths 14, and a communicating portion 15 so as to correspond to the piezoelectric elements 300.

Then, unnecessary portions at the outer peripheral portions of the passage-forming substrate wafer 110 and the protective substrate wafer 130 are removed by cutting, e.g., by dicing. Subsequently, a nozzle plate 20 perforated with nozzle orifices 21 is bonded to the passage-forming substrate wafer 110 on the side opposite to the protective substrate wafer 130, and a compliance substrate 40 is bonded to the protective substrate wafer 130. The passage-forming substrate wafer 110 and other associated components are divided into individual chip-sized passage-forming substrates 10 and other components as shown in FIG. 1 to give the ink jet recording head of the embodiment.

In this embodiment, the zirconium oxide layer 52 formed by a liquid-phase method is disposed on the passage-forming substrate 10 side of the diaphragm 50, and the metal oxide layer 53 formed by a gas-phase method is disposed on the piezoelectric layer 70 side. The invention is not limited to this configuration. Modifications of the diaphragm will be described with reference to FIGS. 10 to 16.

Figure 10:
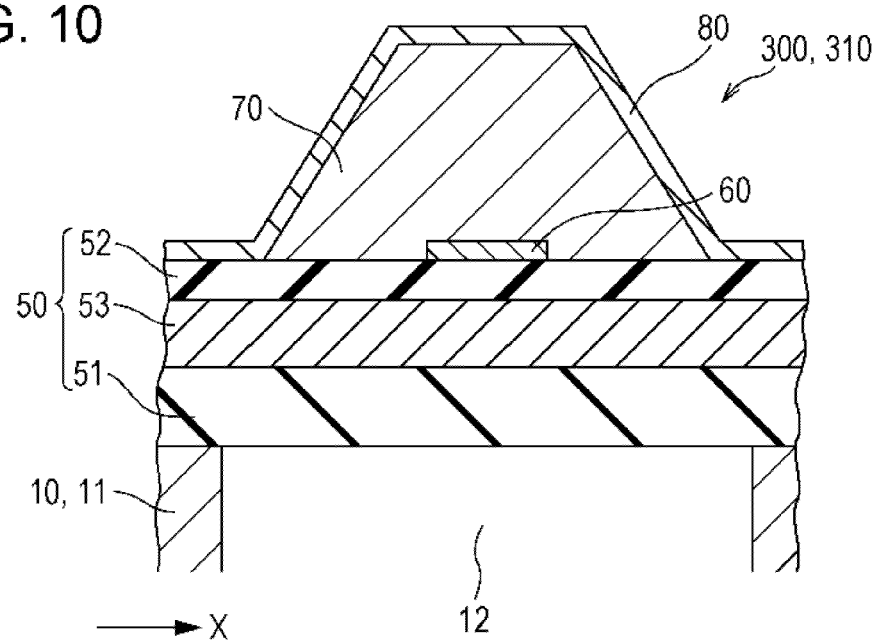
FIG. 10 is a cross-sectional view illustrating a modification of the diaphragm according to Embodiment 1 of the invention.

As shown in FIG. 10, the diaphragm 50 includes an oxide layer 51 made of an oxide, in this embodiment, silicon oxide, disposed on the passage-forming substrate 10 side; a metal oxide layer 53 made of a metal oxide formed by a gas-phase method on the oxide layer 51; and a zirconium oxide layer 52 made of zirconium oxide formed by a liquid-phase method on the metal oxide layer 53. The metal oxide constituting the metal oxide layer 53 may be the same material as that in Embodiment 1.

The diaphragm 50 can be easily thickened by providing the metal oxide layer 53. The adhesion between the diaphragm 50 and the first electrode 60 and between the diaphragm 50 and the piezoelectric layer 70 can be increased by providing the zirconium oxide layer 52 as the uppermost layer on the piezoelectric layer 70 side of the diaphragm 50. In addition, the zirconium oxide layer 52 provided as the uppermost layer on the piezoelectric layer 70 side of the diaphragm 50 can further certainly inhibit the components contained in the piezoelectric layer 70 from diffusing into the metal oxide layer 53, the oxide layer 51, and the passage-forming substrate 10. That is, in a configuration in which the metal oxide layer 53 is disposed on the piezoelectric layer 70 side, the components contained in the piezoelectric layer 70 may diffuse into the metal oxide layer 53 to deteriorate the metal oxide layer 53. However, in the configuration in which the zirconium oxide layer 52 formed by a liquid-phase method is disposed on the piezoelectric layer 70 side, the zirconium oxide layer 52 can inhibit the diffusion of the components contained in the piezoelectric layer 70 into the metal oxide layer 53 to prevent the metal oxide layer 53 from being deteriorated. Consequently, the metal oxide layer 53 may be formed of a material that allows diffusion of the components of the piezoelectric layer 70 thereinto.

Figure 11:
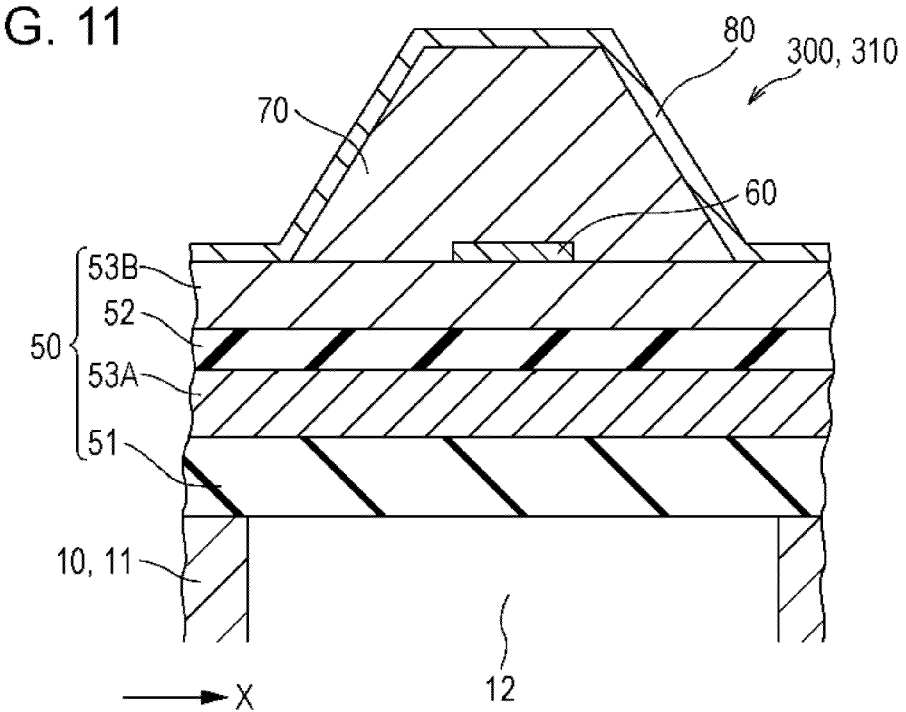
FIG. 11 is a cross-sectional view illustrating another modification of the diaphragm according to Embodiment 1 of the invention.

As shown in FIG. 11, the diaphragm 50 includes an oxide layer 51 made of an oxide, in this embodiment, silicon oxide, disposed on the passage-forming substrate 10 side; a first metal oxide layer 53A made of a metal oxide formed by a gas-phase method on the oxide layer 51; a zirconium oxide layer 52 made of zirconium oxide formed by a liquid-phase method on the first metal oxide layer 53A; and a second metal oxide layer 53B made of a metal oxide formed by a gas-phase method on the zirconium oxide layer 52. The metal oxides constituting the first metal oxide layer 53A and the second metal oxide layer 53B may be the same material as that for the metal oxide layer 53 in Embodiment 1 described above.

The diaphragm 50 can be easily thickened by providing the first metal oxide layer 53A and the second metal oxide layer 53B. As described above, zirconium oxide formed with a large thickness by a gas-phase method has a rough surface and disadvantageously affect the films (the first electrode 60 and the piezoelectric layer 70) that are subsequently formed. In the configuration shown in FIG. 11, the gas-phase method is performed twice to form the first metal oxide layer 53A and the second metal oxide layer 53B. Consequently, the diaphragm 50 can be thickened without roughening the surface thereof.

The zirconium oxide layer 52 formed by a liquid-phase method between the first metal oxide layer 53A and the second metal oxide layer 53B can enhance the adhesion between the first metal oxide layer 53A and the second metal oxide layer 53B to inhibit delamination.

Furthermore, the zirconium oxide layer 52 can inhibit the components contained in the piezoelectric layer 70 from diffusing into the first metal oxide layer 53A, the oxide layer 51, and the passage-forming substrate 10.

Figure 12:
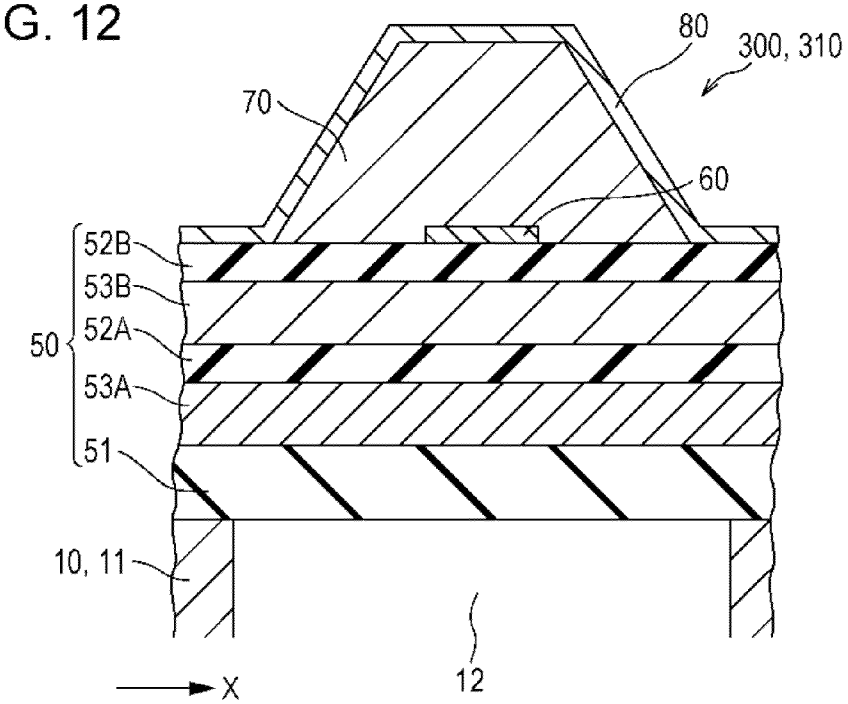
FIG. 12 is a cross-sectional view illustrating another modification of the diaphragm according to Embodiment 1 of the invention.

As shown in FIG. 12, the diaphragm 50 includes an oxide layer 51 made of an oxide, in this embodiment, silicon oxide, disposed on the passage-forming substrate 10 side; a first metal oxide layer 53A made of a metal oxide formed by a gas-phase method on the oxide layer 51; a first zirconium oxide layer 52A made of zirconium oxide formed by a liquid-phase method on the first metal oxide layer 53A; a second metal oxide layer 53B made of a metal oxide formed by a gas-phase method on the first zirconium oxide layer 52A; and a second zirconium oxide layer 52B made of zirconium oxide formed by a liquid-phase method on the second metal oxide layer 53B. The metal oxides constituting the first metal oxide layer 53A and the second metal oxide layer 53B may be the same material as that for the metal oxide layer 53 in Embodiment 1 described above.

That is, in the configuration shown in FIG. 12, in addition to the members shown in FIG. 11, a second zirconium oxide layer 52B made of zirconium oxide formed by a liquid-phase method is further disposed on the piezoelectric layer 70 side. As a result, in addition to the effects similar to those by the diaphragm shown in FIG. 11, the adhesion between the second metal oxide layer 53B and the first electrode 60 and between the second metal oxide layer 53B and the piezoelectric layer 70 is increased by the second zirconium oxide layer 52B. In addition, the second zirconium oxide layer 52B can inhibit the components contained in the piezoelectric layer 70 from diffusing into the passage-forming substrate 10, the oxide layer 51, the first metal oxide layer 53A, the first zirconium oxide layer 52A, and the second metal oxide layer 53B.

Figure 13:
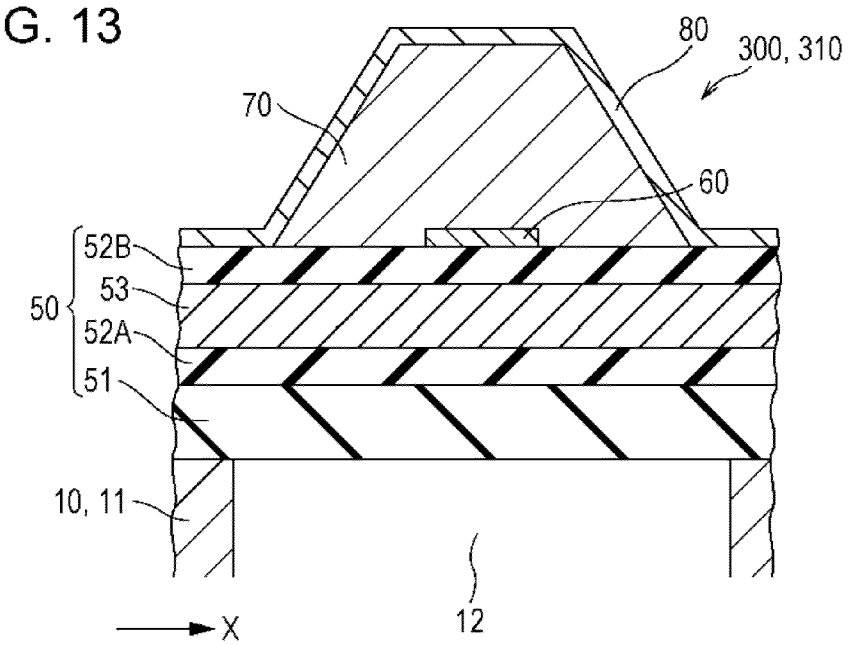
FIG. 13 is a cross-sectional view illustrating another modification of the diaphragm according to Embodiment 1 of the invention.

As shown in FIG. 13, the diaphragm 50 includes an oxide layer 51 made of an oxide, in this embodiment, silicon oxide, disposed on the passage-forming substrate 10 side; a first zirconium oxide layer 52A made of zirconium oxide formed by a liquid-phase method on the oxide layer 51; a metal oxide layer 53 made of a metal oxide formed by a gas-phase method on the first zirconium oxide layer 52A; and a second zirconium oxide layer 52B made of zirconium oxide formed by a liquid-phase method on the metal oxide layer 53. The metal oxide constituting the metal oxide layer 53 may be the same material as that for the metal oxide layer 53 in Embodiment 1 described above.

The diaphragm 50 can be thickened by providing the metal oxide layer 53. The first zirconium oxide layer 52A can enhance the adhesion between the oxide layer 51 and the metal oxide layer 53. In addition, the second zirconium oxide layer 52B can enhance the adhesion between the metal oxide layer 53 and the first electrode 60 and between the metal oxide layer 53 and the piezoelectric layer 70. The second zirconium oxide layer 52B provided as the uppermost layer on the piezoelectric layer 70 side can inhibit the components contained in the piezoelectric layer 70 from diffusing towards the backing side of the second zirconium oxide layer 52B. That is, the diaphragm 50 having the configuration shown in FIG. 13 can most certainly enhance the adhesion between each layer to inhibit delamination and most effectively inhibit diffusion of the components contained in the piezoelectric layer 70.

Figure 14:
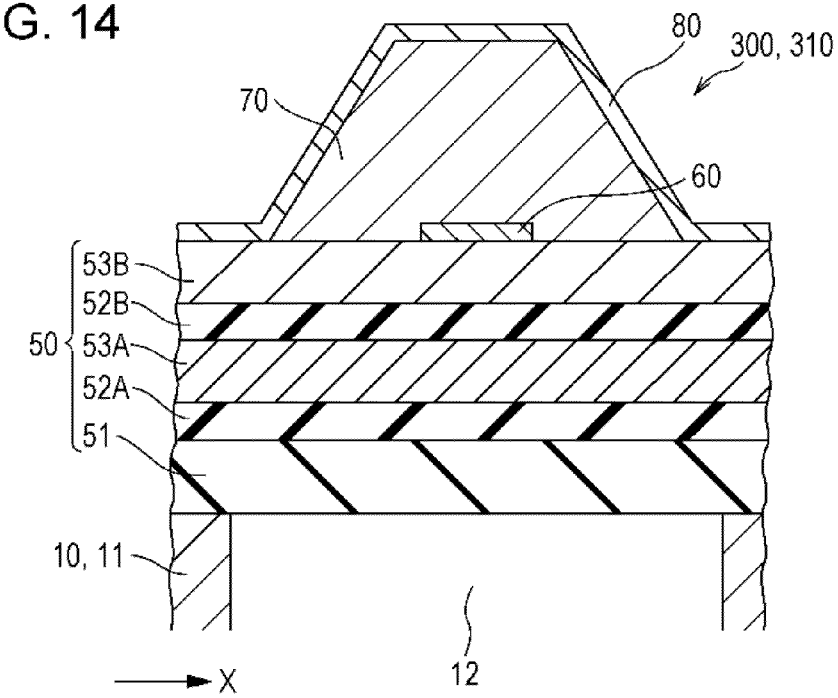
FIG. 14 is a cross-sectional view illustrating another modification of the diaphragm according to Embodiment 1 of the invention.

As shown in FIG. 14, the diaphragm 50 includes an oxide layer 51 made of an oxide, in this embodiment, silicon oxide, disposed on the passage-forming substrate 10 side; a first zirconium oxide layer 52A made of zirconium oxide formed by a liquid-phase method on the oxide layer 51; a first metal oxide layer 53A made of a metal oxide formed by a gas-phase method on the first zirconium oxide layer 52A; a second zirconium oxide layer 52B made of zirconium oxide formed by a liquid-phase method on the first metal oxide layer 53A; and a second metal oxide layer 53B made of a metal oxide formed by a gas-phase method on the second zirconium oxide layer 52B. The metal oxides constituting the first metal oxide layer 53A and the second metal oxide layer 53B may be the same material as that for the metal oxide layer 53 in Embodiment 1 described above.

The diaphragm 50 can be further easily thickened without roughening the surface thereof by providing the first metal oxide layer 53A and the second metal oxide layer 53B in the diaphragm 50. The first zirconium oxide layer 52A can enhance the adhesion between the oxide layer 51 and the first metal oxide layer 53A. The second zirconium oxide layer 52B can enhance the adhesion between the first metal oxide layer 53A and the second metal oxide layer 53B. In addition, the second zirconium oxide layer 52B can inhibit the components contained in the piezoelectric layer 70 from diffusing to the backing side of the second zirconium oxide layer 52B. The diffusion of the components contained in the piezoelectric layer 70 towards the backing side of the second zirconium oxide layer 52B can be further inhibited by providing both the first zirconium oxide layer 52A and the second zirconium oxide layer 52B.

Figure 15:
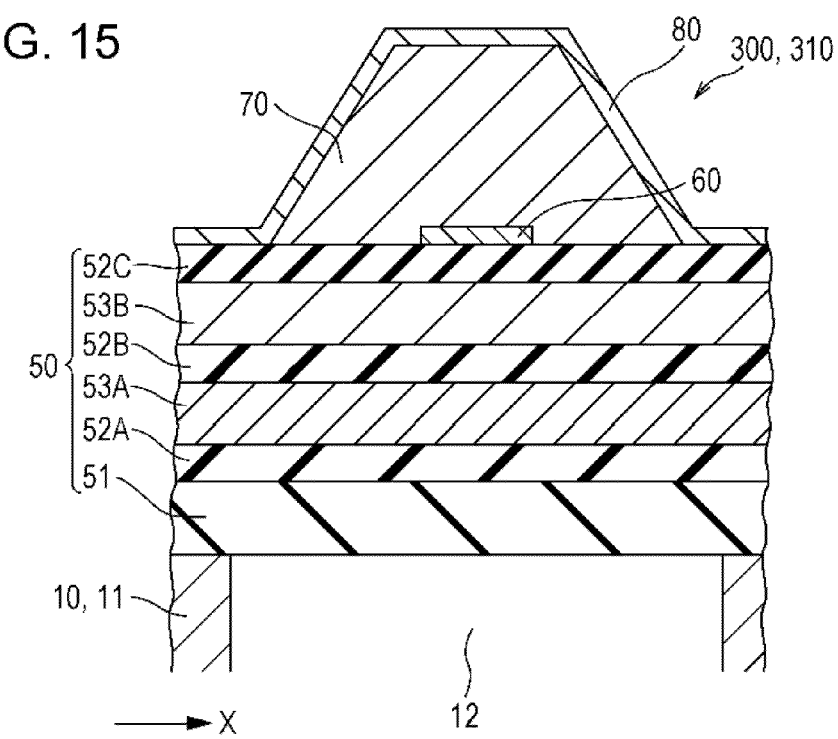
FIG. 15 is a cross-sectional view illustrating another modification of the diaphragm according to Embodiment 1 of the invention.

As shown in FIG. 15, the diaphragm 50 includes an oxide layer 51 made of an oxide, in this embodiment, silicon oxide, disposed on the passage-forming substrate 10 side; a first zirconium oxide layer 52A made of zirconium oxide formed by a liquid-phase method on the oxide layer 51; a first metal oxide layer 53A made of a metal oxide formed by a gas-phase method on the first zirconium oxide layer 52A; a second zirconium oxide layer 52B made of zirconium oxide formed by a liquid-phase method on the first metal oxide layer 53A; a second metal oxide layer 53B made of a metal oxide formed by a gas-phase method on the second zirconium oxide layer 52B; and a third zirconium oxide layer 52C made of zirconium oxide formed by a liquid-phase method on the second metal oxide layer 53B. The metal oxides constituting the first metal oxide layer 53A and the second metal oxide layer 53B may be the same material as that for the metal oxide layer 53 in Embodiment 1 described above.

The diaphragm 50 can be further easily thickened without roughening the surface thereof by providing the first metal oxide layer 53A and the second metal oxide layer 53B in the diaphragm 50. The first zirconium oxide layer 52A can enhance the adhesion between the oxide layer 51 and the first metal oxide layer 53A. The second zirconium oxide layer 52B can enhance the adhesion between the first metal oxide layer 53A and the second metal oxide layer 53B. The third zirconium oxide layer 52C can enhance the adhesion between the diaphragm 50 and the first electrode 60 and between the diaphragm 50 and the piezoelectric layer 70.

The third zirconium oxide layer 52C provided as the uppermost layer on the piezoelectric layer 70 side can inhibit the components contained in the piezoelectric layer 70 from diffusing towards the backing side of the third zirconium oxide layer 52C.

Figure 16:
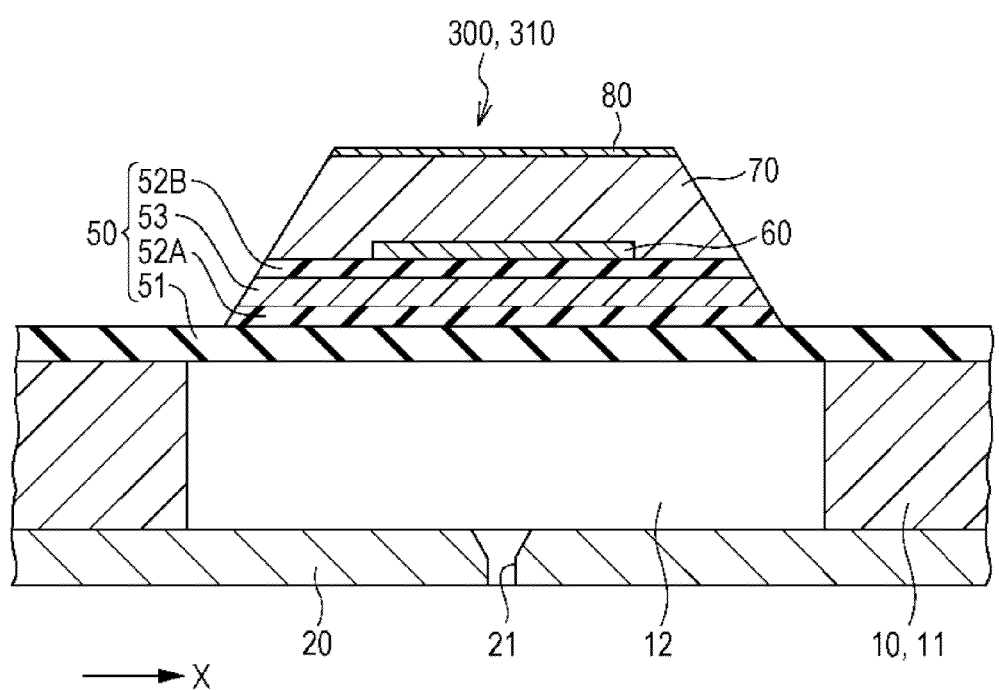
FIG. 16 is a cross-sectional view illustrating another modification of the diaphragm according to Embodiment 1 of the invention.

In this embodiment, the oxide layer 51, the zirconium oxide layers 52, and the metal oxide layers 53 of the diaphragm 50 are disposed so as to continuously cover one surface side of the passage-forming substrate 10 (substrate 10). The diaphragm 50 is not limited to this configuration as long as the zirconium oxide layer 52 and the metal oxide layer 53 are disposed under the piezoelectric layer 70. Specifically, as shown in FIG. 16, the diaphragm 50 includes an oxide layer 51; a first zirconium oxide layer 52A made of zirconium oxide formed by a liquid-phase method on the oxide layer 51; a metal oxide layer 53 made of a metal oxide formed by a gas-phase method on the first zirconium oxide layer 52A; and a second zirconium oxide layer 52B made of zirconium oxide formed by a liquid-phase method on the metal oxide layer 53.

The oxide layer 51 is disposed so as to continuously cover one surface side of the passage-forming substrate 10, whereas the first zirconium oxide layer 52A, the metal oxide layer 53, and the second zirconium oxide layer 52B are selectively formed between the piezoelectric layer 70 and the oxide layer 51. Even in such a configuration, the diaphragm 50 is defined to include the zirconium oxide layer and the metal oxide layer 53 and can exhibit the effects similar to those by the diaphragm shown in FIG. 13. A diaphragm 50 having a cutout portion as shown in FIG. 16 can be applied to any configuration of the above-described embodiments.

Figure 17:
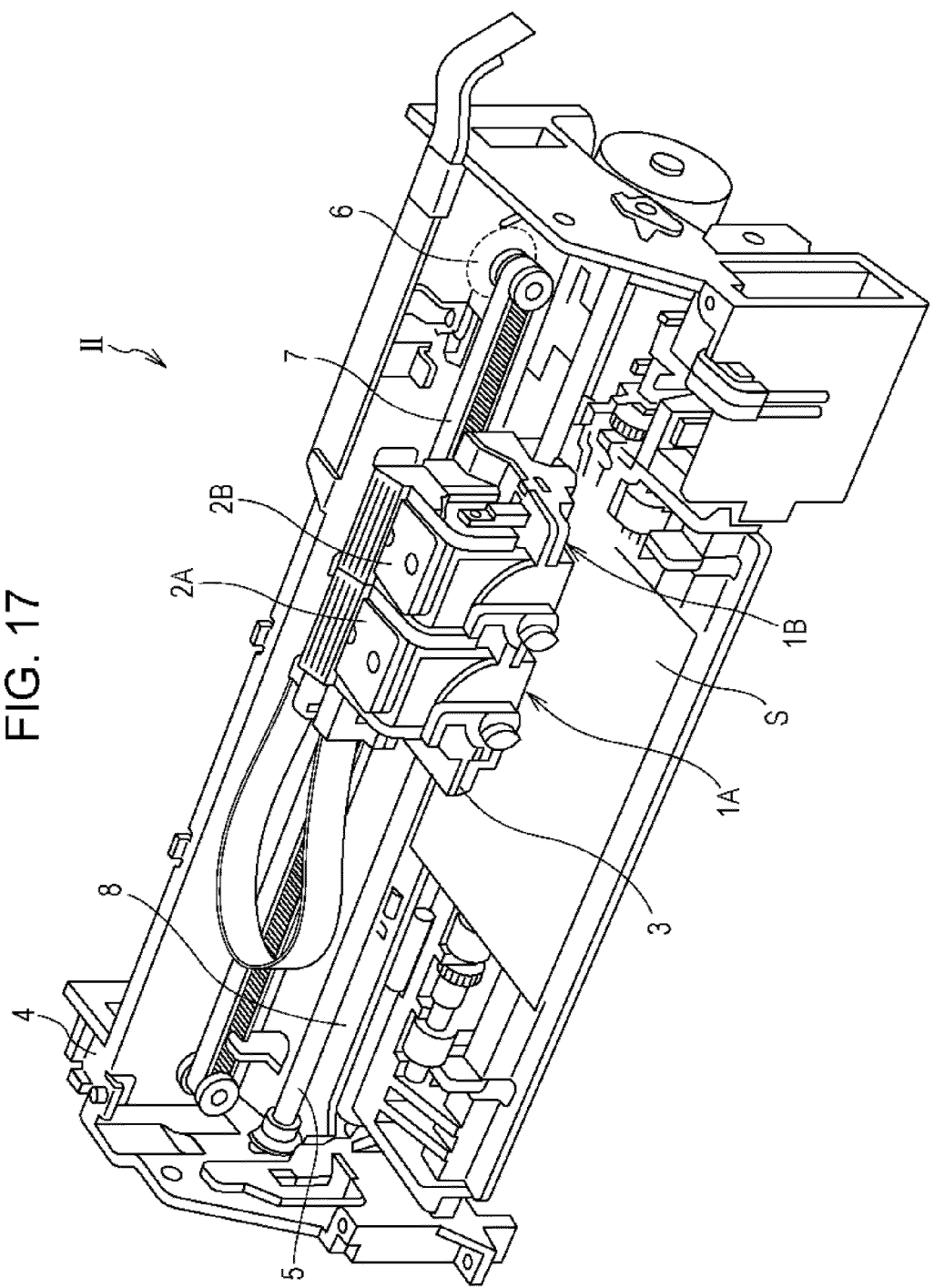
FIG. 17 is a schematic diagram illustrating a recording apparatus according to Embodiment 1 of the invention.

The ink jet recording head I in this embodiment is, for example, as shown in FIG. 17, mounted on an ink jet recording apparatus II. Recording head units 1A and 1B including the ink jet recording heads I are detachably provided with ink cartridges 2A and 2B constituting ink supplying means. A carriage 3 on which the recording head units 1A and 1B are mounted is set to a carriage axis 5, which is fixed to an apparatus body 4, in such a manner that the carriage 3 is movable in the axial direction. The recording head units 1A and 1B eject, for example, a black ink composition and a color ink composition, respectively.

Driving force of a driving motor 6 is transferred to the carriage 3 through a plurality of gears (not shown) and a timing belt 7, and thereby the carriage 3, on which the recording head units 1A and 1B are mounted, is moved along the carriage axis 5. The apparatus body 4 is provided with a platen 8 along the carriage axis 5, and a recording sheet S, a recording medium such as paper, is fed by, for example, a feeding roller (not shown) and is wrapped around the platen 8 and thereby transported.

The invention, as described above, can uniformize the ejection properties while inhibiting destruction of the piezoelectric element 300 constituting the ink jet recording head I. As a result, an ink jet recording apparatus II having improved printing quality and enhanced durability is provided.

In the ink jet recording apparatus II described as an example above, the ink jet recording head I is mounted on the carriage 3 and moves in the main scanning direction. The invention is not limited to this structure. The ink jet recording apparatus II may be, for example, a line-type recording apparatus, in which the ink jet recording head I is fixed, and printing is performed by moving a recording sheet S, such as paper, in a sub scanning direction.

In the ink jet recording apparatus II described as an example above, ink cartridges 2A and 2B as liquid storage means are mounted on the carriage 3. The invention is not limited to this structure. For example, a liquid storage means such as an ink tank may be fixed to the apparatus body 4, and the storage means may be connected to the ink jet recording head I via a supplying pipe such as a tube. The liquid storage means may not be mounted on the ink jet recording apparatus.

Embodiment 2

An ultrasonic transducer as an embodiment of the invention and an ultrasonic device on which the ultrasonic transducer is mounted will now be described. The embodiment described below does not limit the scope of the invention described in the claims, and not all compositions described in the embodiment are essential for solution by the invention. The same members as those in Embodiment 1 described above are designated with the same reference numerals, and descriptions thereof are omitted.

In this embodiment, transmission and reception of ultrasonic waves are performed with an electroacoustic transducer utilizing a piezoelectric effect. Such an electroacoustic transducer is a piezoelectric element. Ultrasonic waves are transmitted using conversion of electric energy into mechanical energy (reverse piezoelectric effect). A change by contraction and extension of a piezoelectric layer is induced so as to vibrate a diaphragm to transmit ultrasonic waves. Accordingly, the piezoelectric element in this case is an ultrasonic transducer for transmission.

In order to receive ultrasonic waves reflected by a target, conversion of mechanical energy into electric energy (direct piezoelectric effect) is used. Deformation of a piezoelectric layer generates electric energy, and the signal of the electric energy is detected. Accordingly, the piezoelectric element in this case is an ultrasonic transducer for reception.

In this embodiment, the piezoelectric element includes a diaphragm, a first electrode disposed on the diaphragm, a piezoelectric layer disposed on the first electrode, and a second electrode disposed on the piezoelectric layer.

Figure 18A:
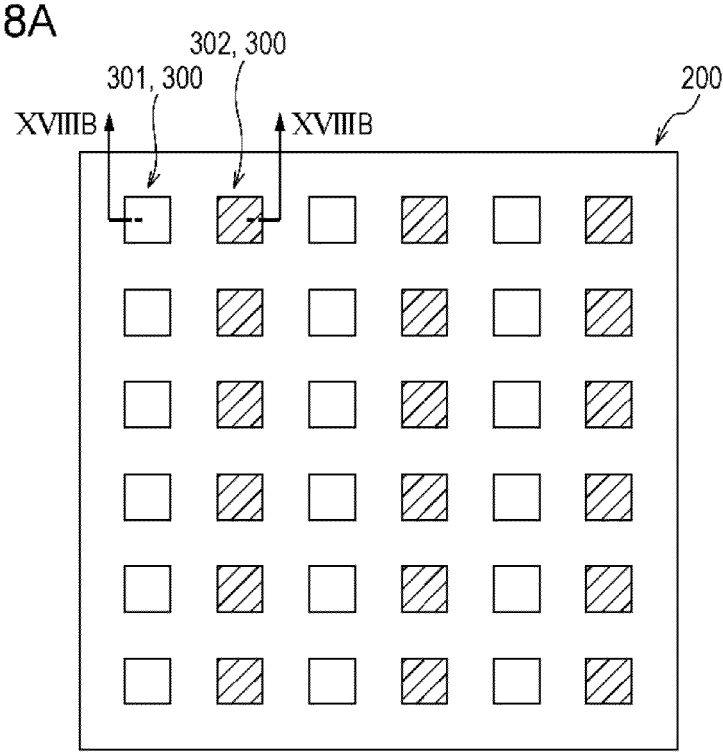
FIG. 18A a plan view of an ultrasonic device according to Embodiment 2 of the invention.
Figure 18B:
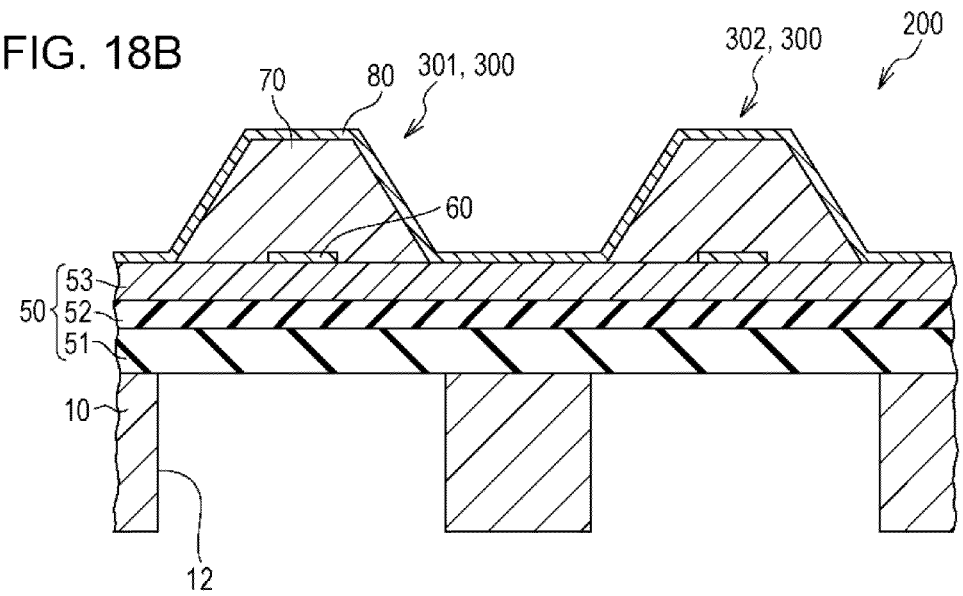
FIG. 18B is a cross-sectional view of the ultrasonic device shown in FIG. 18A, taken along the line XVIIIB-XVIIIB.

FIG. 18A is a plan view of an ultrasonic device on which an ultrasonic transducer according to Embodiment 2 of the invention is mounted. FIG. 18B is a cross-sectional view of the ultrasonic device, taken along the line XVIIIB-XVIIIB.

As shown in FIG. 18A, a plurality of ultrasonic transducers 301 for transmission and ultrasonic transducers 302 for reception are provided in an array on a substrate 10 having substrate openings 12 to form an ultrasonic device 200 (array sensor). Lines of the ultrasonic transducers 301 for transmission and lines of the ultrasonic transducers 302 for reception are alternately aligned. Energization is switched for each line of the transducers. Line scan or sector scan is implemented in accordance with the switching of such energization. The output and input levels of ultrasonic waves are determined depending on the number of transducers and the number of lines to be energized. In the drawing, only six lines of six transducers in each line are shown for simplification. The number of lines and the number of transducers in each line are determined depending on the scan range.

The ultrasonic transducers 301 for transmission and the ultrasonic transducers 302 for reception may be alternately arranged. In such a case, an ultrasonic wave-transmitting and receiving source having coincident central axes of transmission and reception is formed so that the directional angles of the transmission and reception easily coincide.

In this embodiment, in order to reduce the size of the device, both the ultrasonic transducers 301 for transmission and the ultrasonic transducers 302 for reception are arranged on a single substrate 10. The ultrasonic transducers 301 for transmission and the ultrasonic transducers 302 for reception may be arranged on different substrates depending on the function of the ultrasonic transducers. Alternatively, a plurality of substrates may be used depending on the purpose. Furthermore, a single ultrasonic transducer can have both functions of transmission and reception utilizing a time difference between transmission and reception.

In an example of the ultrasonic transducer shown in FIG. 18B, for example, the substrate 10 is a monocrystal silicon substrate having (100), (110), or (111) orientation. The substrate may be one other than those made of silicon materials. For example, ceramic materials, such as $ZrO_2$ and $Al_2O_3$, glass ceramic materials, oxide substrate materials, such as MgO and $LaAlO_3$, and inorganic materials, such as SiC, $SiO_2$, polycrystalline silicon, and $Si_3N_4$, can be used. Laminate materials of these materials can also be used.

A diaphragm 50 is formed above the substrate 10 (piezoelectric layer 70 side). The diaphragm 50 includes, as in Embodiment 1 described above, an oxide layer 51 of an oxide formed on the substrate 10, a zirconium oxide layer 52 of zirconium oxide ($ZrO_2$) formed by a liquid-phase method on the oxide layer 51, and a metal oxide layer 53 of a metal oxide formed by a gas-phase method on the zirconium oxide layer 52.

In this embodiment, the diaphragm 50 can be easily thickened by forming the metal oxide layer 53 by a gas-phase method. In addition, the zirconium oxide layer 52 formed by a liquid-phase method can enhance its adhesion with the films on the upper and lower surfaces thereof. Furthermore, since the zirconium oxide layer 52 functions as a diffusion-preventing layer for inhibiting diffusion of the components contained in the piezoelectric layer 70, the components contained in the piezoelectric layer 70 are inhibited from diffusing into the backing disposed on the opposite side to the piezoelectric layer 70 side of the zirconium oxide layer 52.

The thickness of the diaphragm 50 is determined based on the resonance frequency. In this embodiment, since the diaphragm 50 can be easily thickened by forming the metal oxide layer 53 by a gas-phase method, driving at a high frequency is possible.

The substrate 10 is provided with substrate openings 12. The substrate openings 12 can be formed by a machining method such as etching, polishing, or laser machining depending on the substrate material.

The first electrode 60, the piezoelectric layer 70, and the second electrode 80 are the same as those described in Embodiment 1, and the descriptions for the compositions thereof are omitted. The ultrasonic device needs to be driven at a high-frequency region compared to the liquid ejecting head represented by the ink jet recording head I described in Embodiment 1. Accordingly, the configurations, thicknesses, and physical properties, such as Young's modulus, of the piezoelectric layer 70, the diaphragm 50, each electrode material, and the substrate 10 may be controlled.

Each of the ultrasonic transducers 301 for transmission and ultrasonic transducers 302 for reception is connected to wiring (not shown). The wiring is connected to the terminal (not shown) of a control board (not shown) through a flexible printed board (not shown). The control board is provided with a controlling unit (not shown) including an operation unit and a memory unit. The controlling unit controls input signals to be input into the ultrasonic transducers 301 for transmission and also processes output signals output from the ultrasonic transducers 302 for reception.

In the ultrasonic device of the invention, piezoelectric elements 300 produced using MEMS technology can be arranged at small pitches (high resolution), compared to sensors including bulk piezoelectric ceramics. In addition, the drive voltage is low, which is effective for reductions in size and thickness of the device and apparatus on which the device is mounted and for energy saving. In addition, the process variation of the piezoelectric elements 300 is low, which is effective for increasing the recognition accuracy.

The reduction in the thickness of the piezoelectric layer 70 improves the displacement characteristics and is effective for increasing the ultrasonic wave-transmitting and receiving efficiency.

The ultrasonic transducer constituting the ultrasonic device of this embodiment may employ any of the configurations shown in FIGS. 10 to 16 in Embodiment 1.

Other Embodiments

Each embodiment according to an aspect of the invention has been described above, but the basic constitution of the invention is not limited thereto.

For example, in the above-described embodiments, the piezoelectric layer 70 is provided so as to continuously cover each active portion 310. Alternatively, the piezoelectric layer 70 may be provided so as to independently correspond to each active portion 310. For example, in the above-described embodiments, the second electrode 80 is provided as a common electrode for a plurality of active portions 310, and the first electrode 60 is provided as an individual electrode for each active portion 310. The invention is not limited to such a configuration. For example, the first electrode 60 may be provided as a common electrode for a plurality of active portions 310, and the second electrode 80 may be provided as an individual electrode for each active portion 310.

In the above-described embodiments, the piezoelectric film 74 is formed by firing after application, drying, and degreasing. The invention is not limited thereto. For example, the piezoelectric film 74 may be formed by repeating application, drying, and degreasing multiple times, e.g., twice, and then performing firing.

In Embodiment 1 described above, an ink jet recording head has been described as an example of the liquid ejecting head according to the invention. The invention can be widely applied to liquid ejecting heads in general. Examples of the liquid ejecting head include a variety of recording heads of image recording apparatuses such as printers, coloring material ejecting heads used for producing color filters of, for example, liquid crystal displays, electrode material ejecting heads used for forming electrodes of, for example, organic EL displays or field emission displays (FEDs), and bio-organic material ejecting heads used for producing bio-chips.

The invention can also be applied to a variety of sensors including actuator apparatuses or piezoelectric elements that are mounted on various apparatuses, as well as the liquid ejecting heads (ink jet recording heads) and ultrasonic wave devices.

The entire disclosure of Japanese Patent Application No. 2013-051086, filed Mar. 13, 2013 is expressly incorporated by reference herein.

What is claimed is:

1. A piezoelectric element comprising:
   a diaphragm;
   a first electrode disposed on the diaphragm;
   a piezoelectric layer disposed on the first electrode; and
   a second electrode disposed on the piezoelectric layer,
   wherein the diaphragm includes two metal oxide layers each having a columnar crystal structure and a zirconium oxide layer having a granular crystal structure, the zirconium oxide layer being disposed between the two metal oxide layers.

2. An ultrasonic transducer comprising the piezoelectric element according to claim 1.

3. An ultrasonic device comprising:
   a substrate provided with an orifice; and
   the ultrasonic transducer according to claim 2 disposed on the substrate.

4. The piezoelectric element according to claim 1, wherein the metal oxide of the two metal oxide layers is at least one selected from the group consisting of zirconium oxide, titanium oxide, yttria-stabilized zirconia, and aluminum oxide.

5. A liquid ejecting head comprising the piezoelectric element according to claim 1.

6. A liquid ejecting apparatus comprising the liquid ejecting head according to claim 5.

7. A piezoelectric element comprising:
   a diaphragm;
   a substrate on which the diaphragm is disposed,
   a first electrode disposed on the diaphragm;
   a piezoelectric layer disposed on the first electrode; and
   a second electrode disposed on the piezoelectric layer,
   wherein the diaphragm includes a metal oxide layer having a columnar crystal structure, a zirconium oxide layer having a granular crystal structure, and another oxide layer made of an oxide of a material different from the metal oxide for the metal oxide layer, the another oxide layer being disposed on the substrate side.

8. An ultrasonic transducer comprising the piezoelectric element according to claim 7.

9. An ultrasonic device comprising:
   a substrate provided with an orifice; and
   the ultrasonic transducer according to claim 8 disposed on the substrate.

10. The piezoelectric element according to claim 8, wherein the zirconium oxide layer is disposed on the substrate side.

11. The piezoelectric element according to claim 8, wherein the zirconium oxide layer is disposed on the first electrode side.

12. The piezoelectric element according to claim 8, wherein the metal oxide is at least one selected from the group consisting of zirconium oxide, titanium oxide, yttria-stabilized zirconia, and aluminum oxide.

13. A liquid ejecting head comprising the piezoelectric element according to claim 8.

14. A liquid ejecting apparatus comprising the liquid ejecting head according to claim 13.

15. A piezoelectric element comprising:
   a diaphragm;
   a first electrode disposed on the diaphragm;
   a piezoelectric layer disposed on the first electrode; and
   a second electrode disposed on the piezoelectric layer,
   wherein the diaphragm includes a zirconium oxide layer having a granular crystal structure and a metal oxide layer having a columnar crystal structure deposited on the zirconium oxide layer, the zirconium oxide layer inhibiting diffusion of components of the piezoelectric layer towards the metal oxide layer side.

16. An ultrasonic transducer comprising the piezoelectric element according to claim 15.

17. An ultrasonic device comprising:
   a substrate provided with an orifice; and
   the ultrasonic transducer according to claim 16 disposed on the substrate.

18. The piezoelectric element according to claim 15, wherein the metal oxide is at least one selected from the group consisting of zirconium oxide, titanium oxide, yttria-stabilized zirconia, and aluminum oxide.

19. A liquid ejecting head comprising the piezoelectric element according to claim 15.

20. A liquid ejecting apparatus comprising the liquid ejecting head according claim 19.

* * * * *